United States Patent
Funakubo et al.

(10) Patent No.: US 10,734,204 B2
(45) Date of Patent: *Aug. 4, 2020

(54) METHOD FOR CLEANING COMPONENTS OF PLASMA PROCESSING APPARATUS

(71) Applicant: TOKYO ELECTRON LIMITED, Tokyo (JP)

(72) Inventors: Takao Funakubo, Miyagi (JP); Ryuichi Asako, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/248,119

(22) Filed: Jan. 15, 2019

(65) Prior Publication Data
US 2019/0221406 A1   Jul. 18, 2019

(30) Foreign Application Priority Data
Jan. 16, 2018  (JP) ................................ 2018-005001

(51) Int. Cl.
*H01J 37/32* (2006.01)
*H01L 21/3065* (2006.01)
*H01L 21/311* (2006.01)
*H01L 21/027* (2006.01)

(52) U.S. Cl.
CPC .... *H01J 37/32862* (2013.01); *H01L 21/0276* (2013.01); *H01L 21/3065* (2013.01); *H01L 21/31144* (2013.01); *H01J 2237/335* (2013.01); *H01J 2237/3341* (2013.01)

(58) Field of Classification Search
CPC combination set(s) only.
See application file for complete search history.

(56) References Cited

U.S. PATENT DOCUMENTS

2009/0233450 A1   9/2009   Sakao et al.
2010/0051581 A1*  3/2010   Chiou ................... C23C 14/564
                                                  216/37

FOREIGN PATENT DOCUMENTS

JP         2013-175797 A      9/2013

* cited by examiner

*Primary Examiner* — Erin F Bergner
(74) *Attorney, Agent, or Firm* — Rothwell, Figg, Ernst & Manbeck, P.C.

(57) ABSTRACT

There is disclosed a method for cleaning a component of a plasma processing apparatus which is disposed in an inner space defined by a processing chamber of the plasma processing apparatus. The cleaning method comprises: forming a film on the surface of the component, wherein a compound forming the film is generated by polymerization of a first compound contained in a first gas and a second compound contained in a second gas, the first compound being isocyanate and the second compound being amine or a compound having a hydroxyl group; transferring the component from the processing chamber to a heating chamber after substrate treatment is performed in the inner space; and heating the component so that depolymerization of the compound forming the film occurs.

13 Claims, 19 Drawing Sheets

METHOD FOR CLEANING COMPONENTS OF PLASMA PROCESSING APPARATUS

CROSS-REFERENCE TO RELATED APPLICATIONS

This application claims priority to Japanese Patent Application No. 2018-005001 filed on Jan. 16, 2018, the entire contents of which are incorporated herein by reference.

FIELD

The present disclosure relates to a method for cleaning components of a plasma processing apparatus.

BACKGROUND OF THE INVENTION

In manufacturing electronic devices, substrate treatment is performed. The substrate treatment is performed in an inner space of a chamber of a plasma processing apparatus. When the substrate treatment is performed, a deposit is formed on surfaces of components disposed in the inner space of the plasma processing apparatus. The deposit formed on the surfaces of the components should be removed.

Japanese Patent Application Publication No. 2013-175797 discloses therein a technique for removing a fluorocarbon film, which is one of the deposits generated during the substrate treatment by plasma cleaning. In the plasma cleaning, plasma of a cleaning gas is generated, and the fluorocarbon film is removed by active species such as ions and/or radicals in the plasma.

The deposit may be made of materials that are not easily removed by the plasma cleaning (e.g., metal-containing material). Further, the deposit may be formed on a surface that defines a space where the plasma of the cleaning gas hardly reaches. Therefore, there is a demand for a method for cleaning components of a plasma processing apparatus which is different from the plasma cleaning.

SUMMARY OF THE INVENTION

In accordance with an aspect, there is provided a method for cleaning a component of a plasma processing apparatus which is disposed in an inner space defined by a processing chamber of the plasma processing apparatus. The cleaning method comprises: forming a film on the surface of the component, wherein a compound forming the film is generated by polymerization of a first compound contained in a first gas and a second compound contained in a second gas, the first compound being isocyanate and the second compound being amine or a compound having a hydroxyl group; transferring the component from the processing chamber to a heating chamber after substrate treatment is performed in the inner space; and heating the component so that depolymerization of the compound forming the film occurs.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
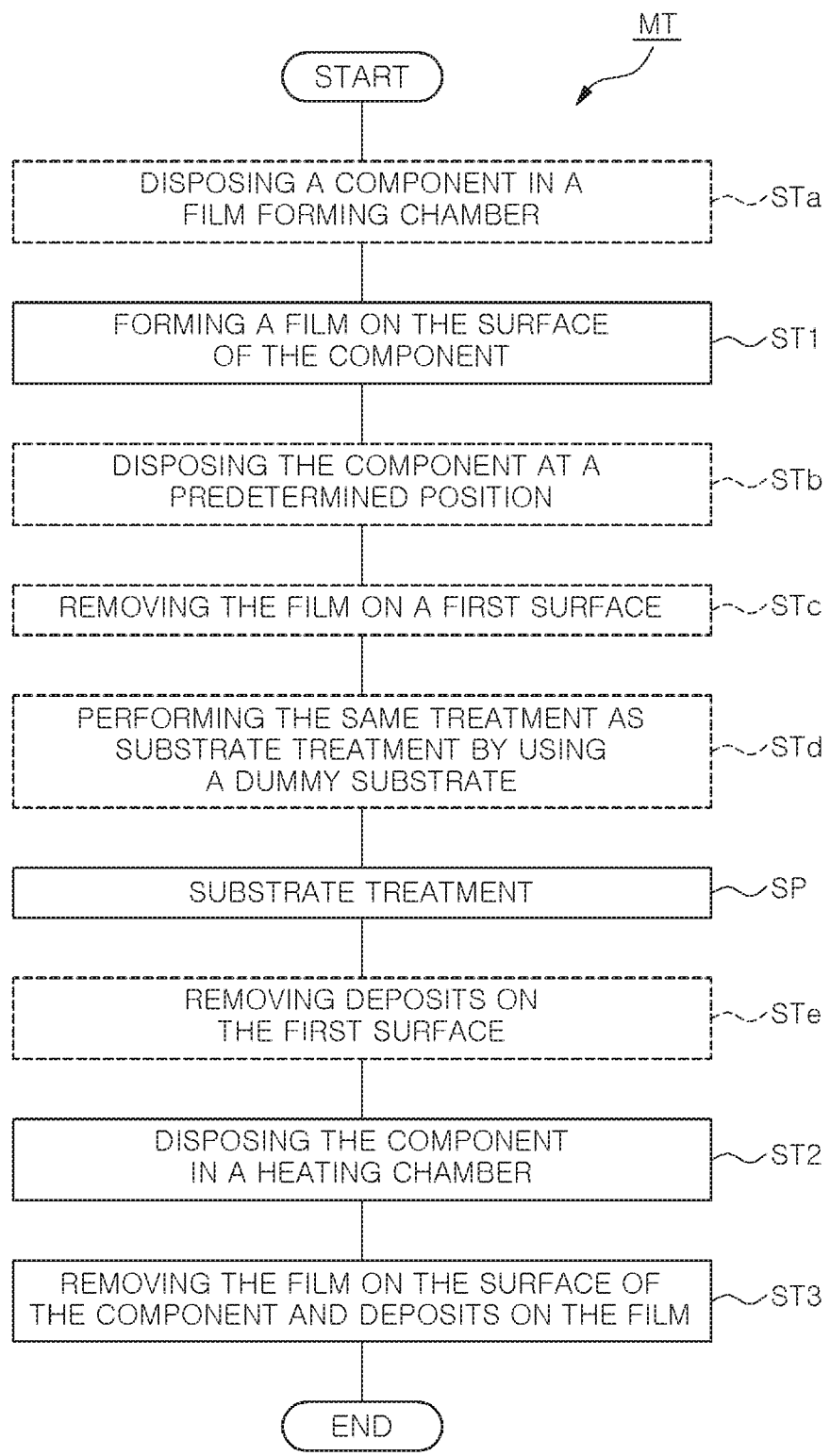
FIG. 1 is a flowchart showing a cleaning method according to an embodiment.

Hereinafter, embodiments will be described in detail with reference to the accompanying drawings. Like reference numerals will be given to like or corresponding parts throughout the drawings.

FIG. 1 is a flowchart showing a cleaning method according to an embodiment. The cleaning method (hereinafter, referred to as "method MT") shown in FIG. 1 is performed to clean components of a plasma processing apparatus. FIG.

Figure 2:
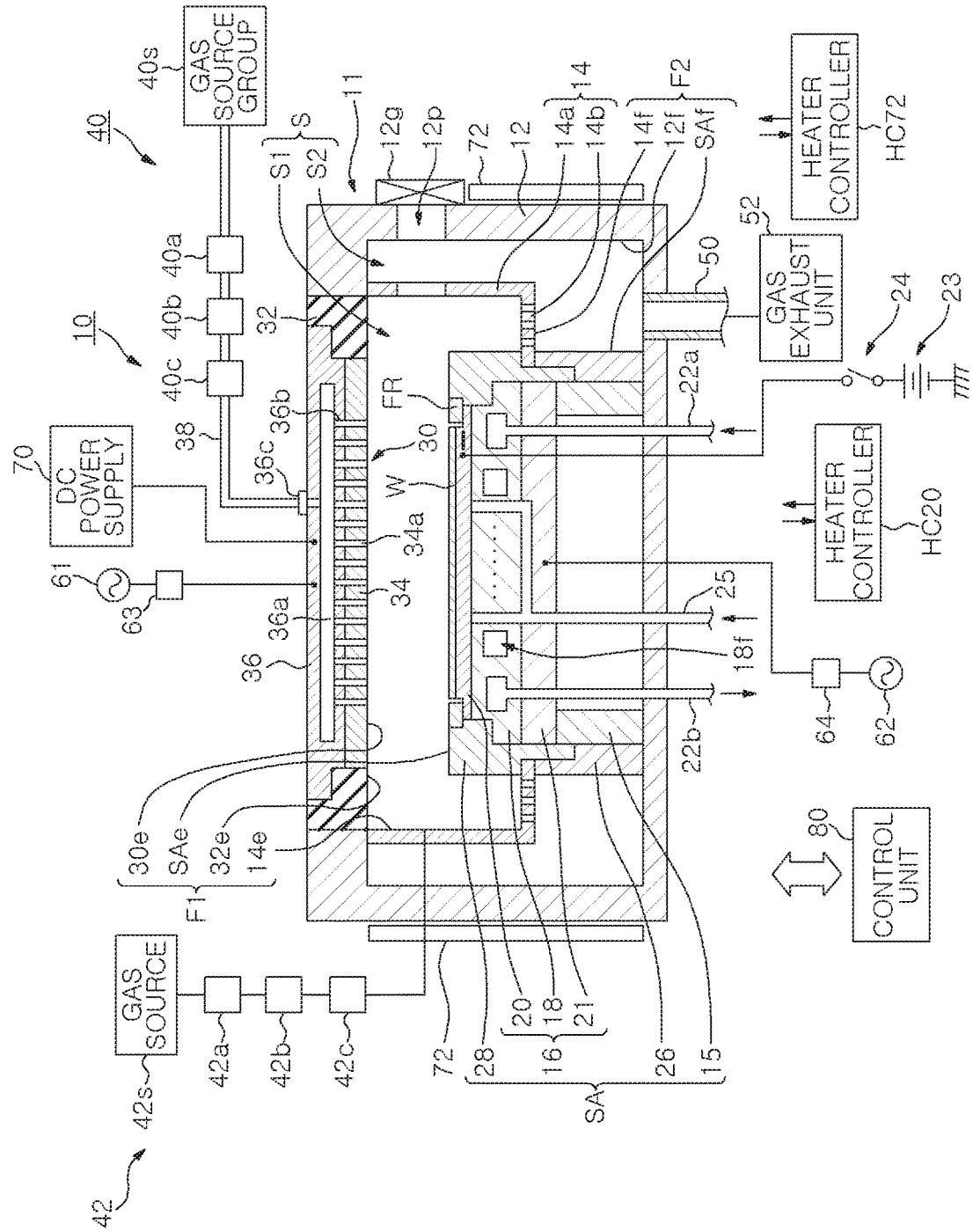
FIG. 2 schematically shows an example of a plasma processing apparatus to which the cleaning method shown in FIG. 1 can be applied.

2 schematically shows an example of a plasma processing apparatus to which the cleaning method shown in FIG. 1 can be applied. A plasma processing apparatus 10 shown in FIG. 2 is a capacitively coupled plasma processing apparatus.

The plasma processing apparatus 10 includes a processing chamber 11. The processing chamber 11 has an inner space S therein. The inner space S includes a first space S1 and a second space S2. The processing chamber 11 includes a chamber body 12. The chamber body 12 has a substantially cylindrical shape. The chamber body 12 has the inner space S therein. The chamber body 12 is made of, e.g., aluminum. The chamber body 12 is connected to a ground potential. A corrosion resistant film is formed on an inner wall surface of the chamber body 12, i.e., on a surface of the chamber body 12 which defines the inner space S. This film may be a film formed by anodic oxidation treatment, or a ceramic film made of yttrium oxide.

A passage 12p is formed in the sidewall of the chamber body 12. The substrate W is transferred between the inner space S and the outside of the processing chamber 11 through the passage 12p. The passage 12p can be opened and closed by a gate valve 12g. The gate valve 12g is provided along the sidewall of the chamber body 12.

A partition wall 14 is provided in the inner space S. The partition wall 14 is an example of the component to be cleaned by the method MT. The component to be cleaned by the method MT can be disposed at a predetermined position in the inner space S and can be taken out to the outside of the inner space S. The partition wall 14 extends on the boundary between the first space S1 and the second space S2. The first space S1 and the second space S2 communicate with each other through a plurality of through-holes formed in the partition wall 14. The partition wall 14 may be formed by forming a corrosion resistant film on a surface of an aluminum base. The corrosion resistant film may be a film formed by anodic oxidation treatment, or a ceramic film made of yttrium oxide.

In one embodiment, the partition wall 14 includes a shield portion 14a and a baffle plate 14b. The shield portion 14a has a substantially cylindrical shape. The shield portion 14a extends in a vertical direction along the sidewall of the chamber body 12 in the inner space S. The shield portion 14a is separated from the sidewall of the chamber body 12. An upper end of the shield portion 14a extends to an upper portion of the processing chamber 11 and is fixed to the upper portion. In the plasma processing apparatus 10, substrate treatment is performed in the first space S1. During the substrate treatment, by-products such as reaction products and the like are generated. The amount of the by-products adhered to the surface of the chamber body 12 is reduced by the shield portion 14a.

The baffle plate 14b extends in a direction orthogonal to the shield portion 14a. The baffle plate 14b extends between the shield portion 14a and a supporting table to be described later. The above-described through-holes of the partition wall 14 are formed in the baffle plate 14b. The shield portion 14a and the baffle plate 14b may be formed as one unit or may be separable from each other.

In the inner space S, a supporting part 15 extends upward from a bottom portion of the chamber body 12. The supporting part 15 has a substantially cylindrical shape and is made of an insulating material such as quartz. A supporting table 16 is mounted on the supporting part 15. The supporting table 16 is supported by the supporting part 15. The supporting table 16 is configured to support the substrate W in the first space S1. The supporting table 16 includes a lower electrode 18 and an electrostatic chuck 20. The supporting table 16 may further include an electrode plate 21. The electrode plate 21 is made of a conductive material such as aluminum or the like and has a substantially disc shape. The lower electrode 18 is provided on the electrode plate 21. The lower electrode 18 is made of a conductive material such as aluminum or the like and has a substantially disc shape. The lower electrode 18 is electrically connected to the electrode plate 21.

A flow path 18f is provided in the lower electrode 18. The flow path 18f is a channel for a heat exchange medium. As for the heat exchange medium, a liquid coolant or a coolant (e.g., Freon) for cooling the lower electrode 18 by vaporization thereof is used. The heat exchange medium is supplied to the flow path 18f from a chiller unit provided outside the chamber body 12 through a line 22a. The heat exchange medium supplied to the flow path 18f is returned to the chiller unit through a line 22b. In this manner, the heat exchange medium is supplied to the flow path 18f and circulates between the flow path 18f and the chiller unit.

The electrostatic chuck 20 is provided on the lower electrode 18. The electrostatic chuck 20 includes a main body and an electrode. The main body of the electrostatic chuck 20 is made of a dielectric material and has a substantially disc shape. The electrode of the electrostatic chuck 20 is a film-shaped electrode and is provided in the main body of the electrostatic chuck 20. A DC power supply 23 is electrically connected to the electrodes of the electrostatic chuck 20 via a switch 24. When a voltage is applied from the DC power supply 23 to the electrode of the electrostatic chuck 20, an electrostatic attractive force is generated between the substrate W mounted on the electrostatic chuck 20 and the electrostatic chuck 20. Due to the electrostatic attractive force thus generated, the substrate W is attracted to and held on the electrostatic chuck 20.

The plasma processing apparatus 10 further includes a gas supply line 25. A heat transfer gas, e.g., He gas, is through the gas supply line 25 from a gas supply unit to a gap between an upper surface of the electrostatic chuck 20 and a backside (bottom surface) of the substrate W.

One or more heaters (e.g., resistance heating elements) may be provided in the electrostatic chuck 20. Power is supplied from a heater controller HC20 to one or more heaters. A high frequency filter FT20 may be provided between one or more heaters in the electrostatic chuck 20 and the heater controller HC20 to prevent the high frequency from flowing into the heater controller HC20. When a plurality of heaters are provided in the electrostatic chuck 20, temperatures of a plurality of regions of the electrostatic chuck 20 can be individually controlled by controlling the power supplied from the heater controller HC20 to the heaters. Accordingly, it is possible to control temperature distribution in the plane of the electrostatic chuck 20 (i.e., in the plane of the substrate W).

A focus ring FR is disposed on an outer peripheral region of the electrostatic chuck 20. The focus ring FR has a substantially annular plate shape. The focus ring FR is made of a silicon-containing material such as silicon, quartz, or silicon carbide. The focus ring FR is disposed to surround the edge of the substrate W.

A tubular member 26 extends upward from the bottom portion of the chamber body 12. The tubular member 26 extends along an outer periphery of the supporting part 15. The tubular member 26 is made of a conductor and has a substantially cylindrical shape. The tubular member 26 is connected to the ground potential. A corrosion resistant film may be formed on a surface of the tubular member 26. The corrosion resistance film may be a film formed by anodic oxidation treatment, or a ceramic film made of yttrium oxide.

An insulating member 28 is provided on the tubular member 26. The insulating member 28 has an insulating property and is made of ceramic such as quartz. The insulating member 28 has a substantially cylindrical shape and extends along the outer peripheries of the electrode plate 21, the lower electrode 18, and the electrostatic chuck 20. The edge portion of the baffle plate 14b may be provided between the tubular member 26 and the insulating member 28 and may be embedded between the tubular member 26 and the insulating member 28.

The supporting part 15, the supporting table 16, the tubular member 26, and the insulating member 28 constitute a support assembly SA. The support assembly SA extends from the first space S1 to the second space S2.

The plasma processing apparatus 10 further includes an upper electrode 30. The upper electrode 30 is provided above the supporting table 16. The upper electrode 30 blocks an upper opening of the chamber body 12 in cooperation with a member 32. The member 32 has an insulating property. The upper electrode 30 is held on an upper portion of the chamber body 12 through the member 32.

The upper electrode 30 includes a ceiling plate 34 and a holder 36. A bottom surface of the ceiling plate 34 defines the inner space S (or the first space S1). The ceiling plate 34 is provided with a plurality of gas injection holes 34a. The gas injection holes 34a penetrate through the ceiling plate 34 in a plate thickness direction (vertical direction). The ceiling plate 34 is made of, e.g., silicon, but is not limited thereto. Alternatively, the ceiling plate 34 may have a structure in which a plasma resistant film is formed on a surface of an aluminum base material. This film may be a film formed by anodic oxidation treatment or a ceramic film made of yttrium oxide.

The holder 36 detachably holds the ceiling plate 34. The holder 36 may be made of a conductive material, e.g., aluminum. A gas diffusion space 36a is formed inside the holder 36. A plurality of gas holes 36b extends downward from the gas diffusion space 36a. The gas holes 36b communicate with the respective gas injection holes 34a. A gas inlet port 36c for introducing a gas into the gas diffusion space 36a is formed in the holder 36. A gas supply line 38 is connected to the gas inlet port 36c.

A gas supply unit 40 is connected to the gas supply line 38. The gas supply unit 40 constitutes a gas supply system. The gas supply system is connected to the first space S1. The gas supply unit 40 includes a gas source group 40s, a valve group 40a, a flow rate controller group 40b, and a valve group 40c. The gas source group 40s includes a plurality of gas sources. The gas sources include a plurality of gas sources used in the method MT. Each of the valve group 40a and the valve group 40c includes a plurality of valves. The flow rate controller group 40b includes a plurality of flow rate controllers. Each of the flow rate controllers of the flow rate controller group 40b is a mass flow controller or a pressure control type flow controller. The gas sources of the gas source group 40s are respectively connected to the gas supply line 38 through corresponding valves of the valve group 40a, corresponding flow controllers of the flow rate control group 40b, and corresponding valves of the valve group 40c. The gas from the gas supply unit 40 is supplied into the first space S1 via the gas supply line 38, the gas diffusion space 36a, the gas holes 36b, and the gas injection holes 34a.

As will be described later, in a step ST1 of the method MT, a film may be formed on surfaces of components in the processing chamber 11, or may be formed on surfaces of components in a film forming chamber. In the former case, i.e., if the film is formed on the surfaces of the components in the processing chamber in the step ST1 of the method MT, the gas sources of the gas source group 40s includes a source of one of a first gas and a second gas which will be described later. In that case, the gas supply system of the plasma processing apparatus 10 further includes a gas supply unit 42. The gas supply unit 42 includes a gas source 42s, a valve 42a, a flow rate controller 42b, and a valve 42c. The gas source 42s is the source of the other one of the first gas and the second gas. The flow rate controller 42b is a mass flow controller or a pressure control type flow controller. The gas source 42s is connected to the first space S1 via the valve 42a, the flow rate controller 42b, and the valve 42c. The gas from the gas supply unit 42 is supplied into the first space S1.

A gas exhaust line 50 is connected to the bottom portion of the chamber body 12 of the plasma processing apparatus 10. A gas exhaust unit 52 is connected to the gas exhaust line 50. The gas exhaust unit 52 is connected to the second space S2 via the gas exhaust line 50. The gas exhaust unit 52 is also connected to the first space S1 via the second space S2 and the through-holes of the partition wall 14. The gas exhaust unit 52 includes a pressure control valve and a depressurization pump. The depressurization pump is connected to the second space S2 via a pressure control valve. The depressurization pump may be a turbo molecular pump and/or a dry pump.

The plasma processing apparatus 10 can generate plasma of the gas supplied into the first space S1 in the first space S1. The plasma processing apparatus 10 further includes a first high frequency power supply 61. The first high frequency power supply 61 generates a first high frequency power for plasma generation. The first high frequency power has a frequency within a range of 27 MHz to 100 MHz, for example. The first high frequency power supply is connected to the upper electrode 30 via a matching unit 63. The matching unit 63 has a matching circuit for matching an output impedance of the first high frequency power supply 61 and an impedance of a load side (the upper electrode 30 side). The first high frequency power supply may be connected to the lower electrode 18 via the matching unit 63. In that case, the upper electrode 30 is electrically grounded.

The plasma processing apparatus 10 may further include a second high frequency power supply 62. The second high frequency power supply 62 generates a second high frequency power (for bias) for attracting ions to the substrate W. The frequency of the second high frequency is lower than the frequency of the first high frequency. The frequency of the second high frequency is within a range of 400 kHz to 13.56 MHz, for example. The second high frequency power supply 62 is connected to the lower electrode 18 via a matching unit 64. The matching unit 64 has a matching circuit for matching an output impedance of the second high frequency power supply 62 and an impedance of a load side (the lower electrode 18 side).

In the plasma processing apparatus 10, when the first high frequency power is supplied in a state in which a gas is supplied into the first space S1, the gas is excited and plasma is generated in the first space S1. When the second high frequency power is supplied to the lower electrode 18, ions in the plasma are accelerated toward the substrate W.

The plasma processing apparatus 10 further includes a DC power supply 70. The DC power supply 70 is connected to the upper electrode 30. The DC power supply 70 is configured to apply a negative DC voltage to the upper electrode 30. When the negative DC voltage is applied to the upper electrode 30, positive ions in the plasma generated in the first space S1 collide with the ceiling plate 34 of the upper electrode 30. When the positive ions collide with the ceiling plate 34, secondary electrons are emitted from the ceiling plate 34. In the case where the ceiling plate 34 is made of silicon, when the positive ions collide with the ceiling plate 34, silicon can be released from the ceiling plate 34.

In the plasma processing apparatus 10, the surface that defines the inner space S includes a first surface F1 and a second surface F2. The first surface F1 defines the first space S1 and includes a part 14e of the surface of the partition wall 14 and a part SAe of the surface of the support assembly SA. In the example shown in FIG. 2, the part SAe of the surface of the support assembly SA is defined by the insulating member 28. The first surface F1 also includes a part 32e of the surface of the member 32 and a part 30e of the surface of the upper electrode 30. In the example shown in FIG. 2, the part 30e of the surface of the upper electrode 30 is the bottom surface of the ceiling plate 34.

The second surface F2 defines the second space S2. The second surface F2 includes a part 12f of the surface of the chamber body 12. In the example shown in FIG. 2, the part 12f of the surface of the chamber body 12 is defined by the sidewall and the bottom portion of the chamber body 12. The second surface F2 also includes a part SAf of the surface of the support assembly SA. In the example shown in FIG. 2, the part SAf of the surface of the support assembly SA is defined by the tubular member 26. The components to be cleaned by the method MT may include a region that is a part of the second surface F2. A region 14f of the surface of the partition wall 14 which is an example of the components forms a part of the second surface F2.

In one embodiment, the plasma processing apparatus 10 furthers include a heater 72. The heater 72 is provided outside the processing chamber 11. Power is supplied from a heater controller HC72 to the heater 72. When the power is supplied from the heater controller HC72 to the heater 72, the heater 72 generates heat to heat the chamber body 12 and a substance in the chamber body 12.

In one embodiment, the plasma processing apparatus 10 may further include a control unit 80. The control unit 80 is configured to control the respective components of the plasma processing apparatus 10. The control unit 80 may be a computer including a processor, a storage device such as and a memory, an input device, a display device, and the like. The control unit 80 executes a control program stored in the storage device and controls the respective components of the plasma processing apparatus 10 based on a recipe data stored in the storage device. Accordingly, the plasma processing apparatus 10 executes a process specified by the recipe data. For example, the control unit 80 controls the respective components of the plasma processing apparatus 10 in executing the method MT.

The method MT will be described with reference to FIG. 1. The method MT includes steps ST1, ST2 and ST3. In the step ST1, a film is formed on the surfaces of the components of the plasma processing apparatus 10. The step ST1 is executed before substrate treatment in a step SP. The step ST2 is executed after the substrate treatment in the step SP. In the step ST2, the component of the plasma processing apparatus 10 is disposed in a heating chamber. In the step ST3, the component is heated in the heating chamber, and the deposit formed by the substrate treatment is removed together with the film. The method MT may further include at least one of steps STa, STb and STc.

Figure 3:
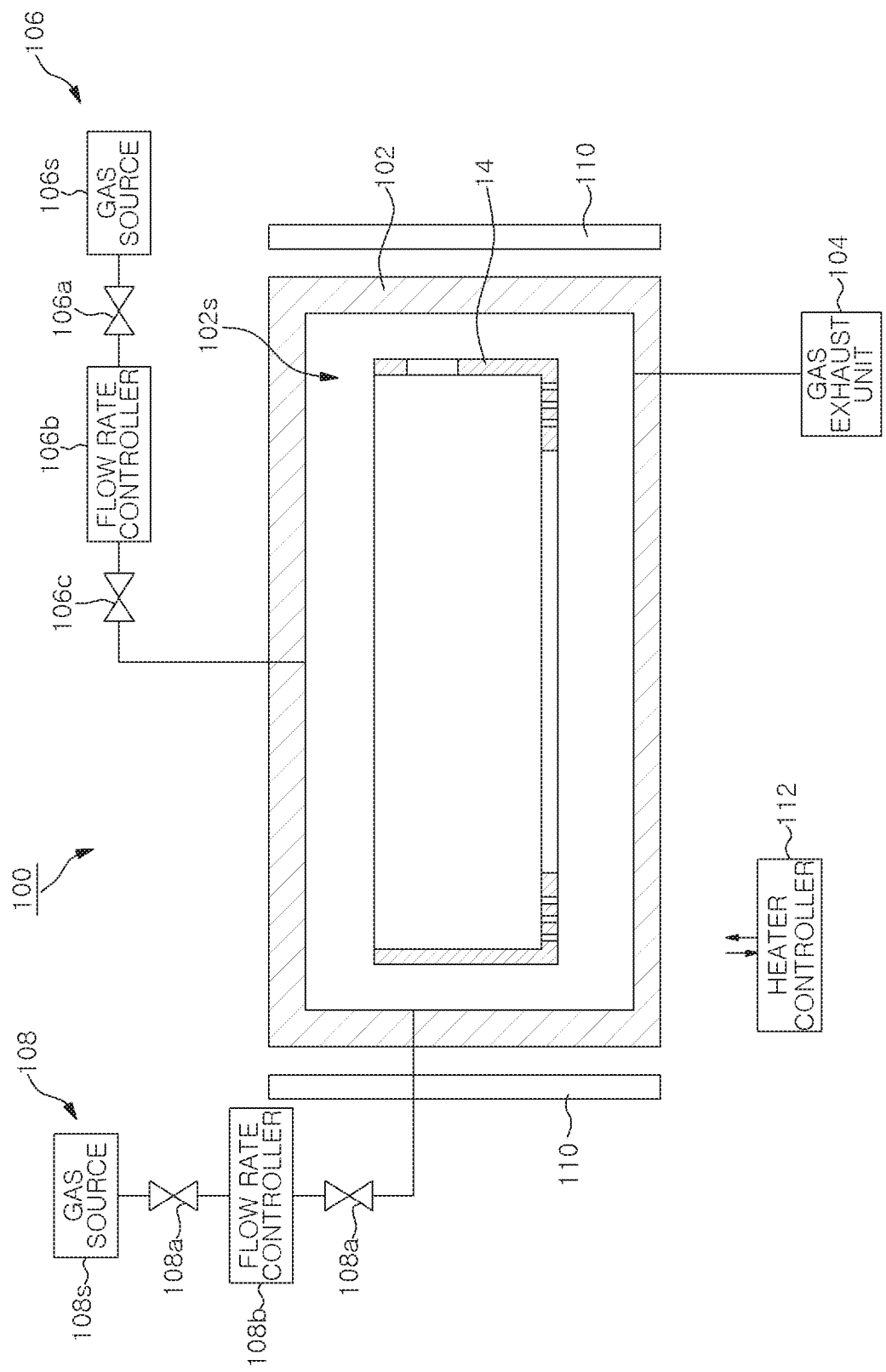
FIG. 3 shows a state of a component of the plasma processing apparatus after execution of a step STa of the cleaning method shown in FIG. 1.
Figure 4:
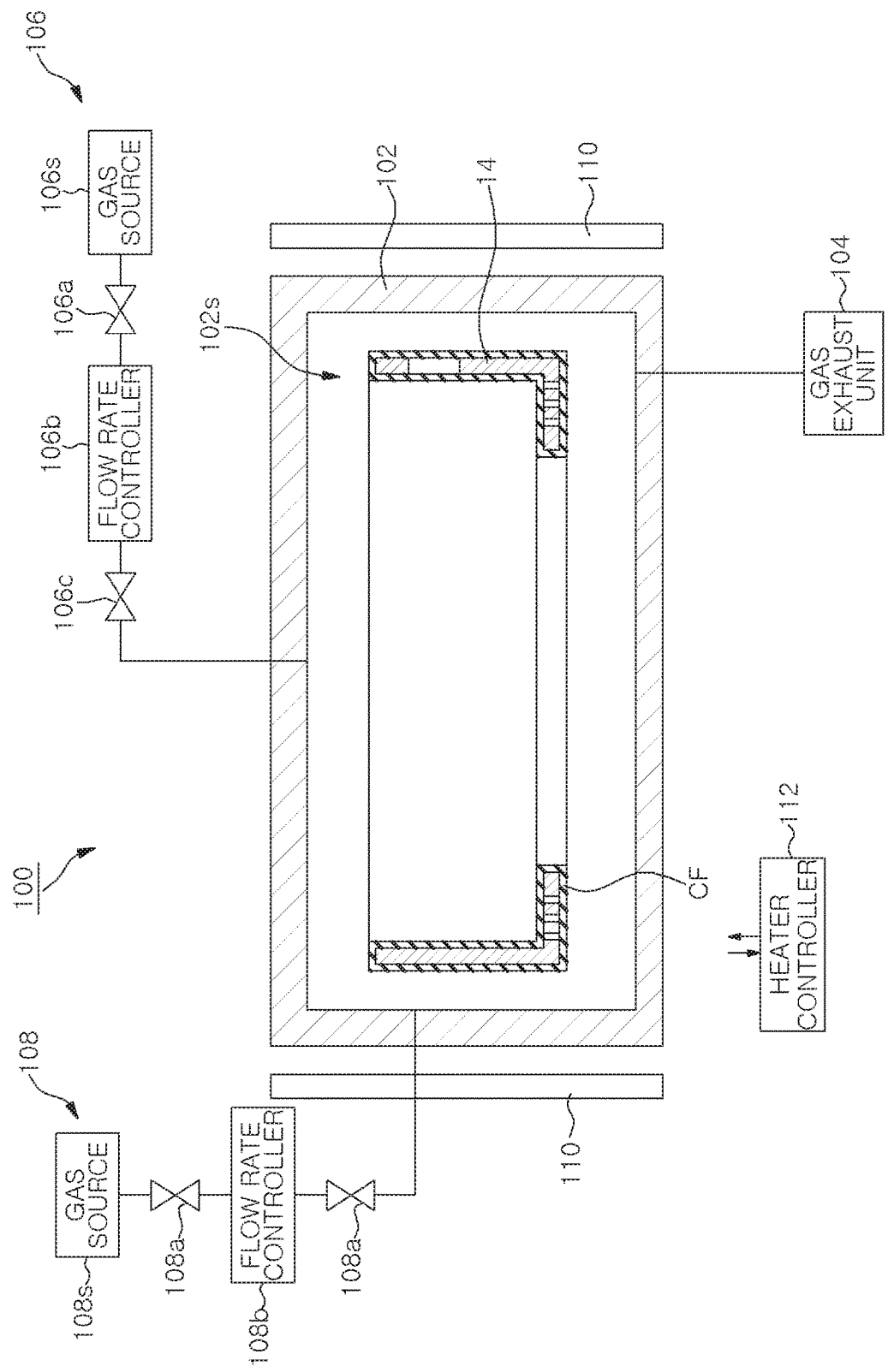
FIG. 4 shows a state of the component of the plasma processing apparatus after execution of a step ST1 of the cleaning method shown in FIG. 1.
Figure 9:
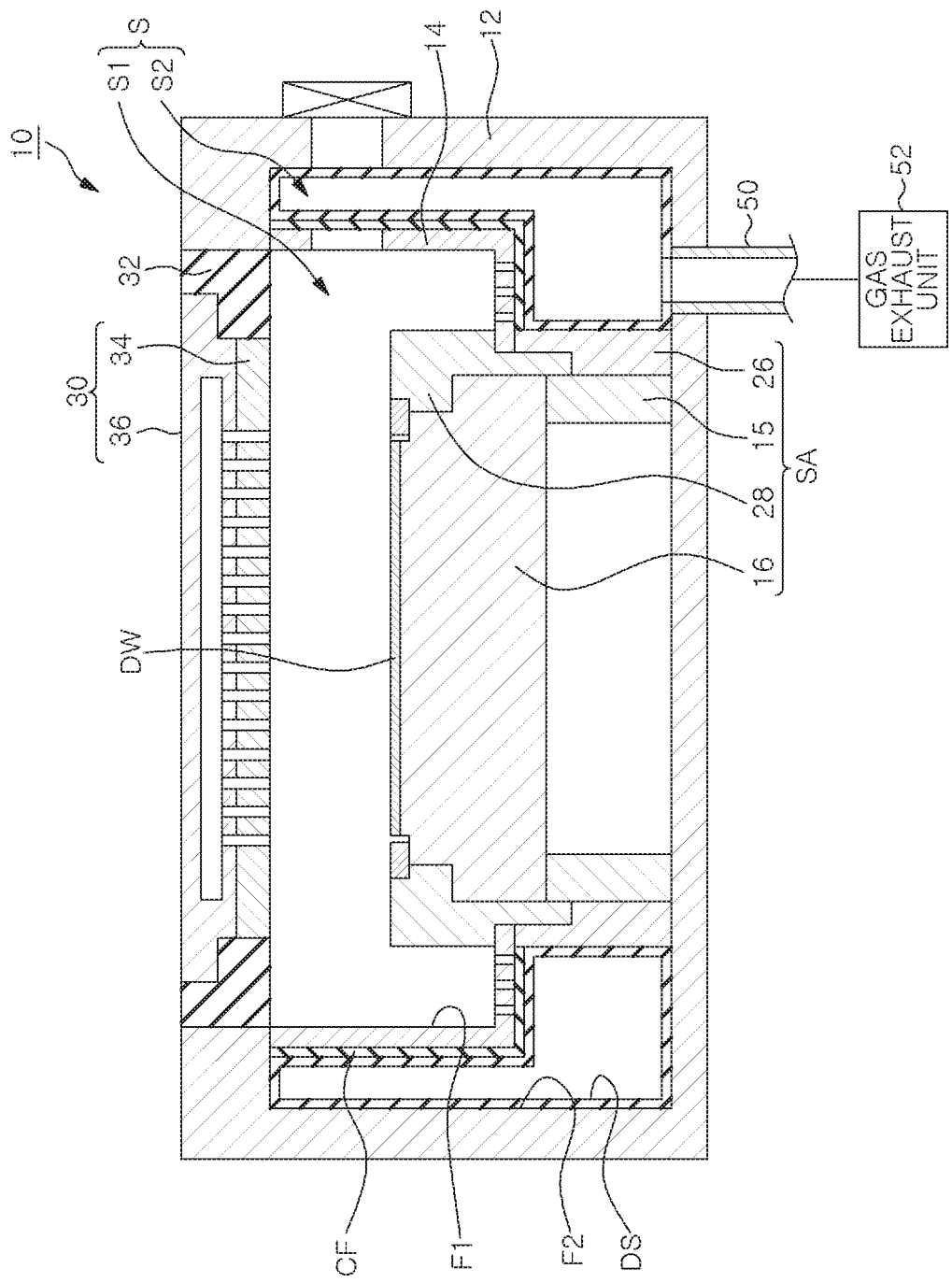
FIG. 9 shows the state of the plasma processing apparatus after execution of a step STe of the cleaning method shown in FIG. 1.
Figure 10:
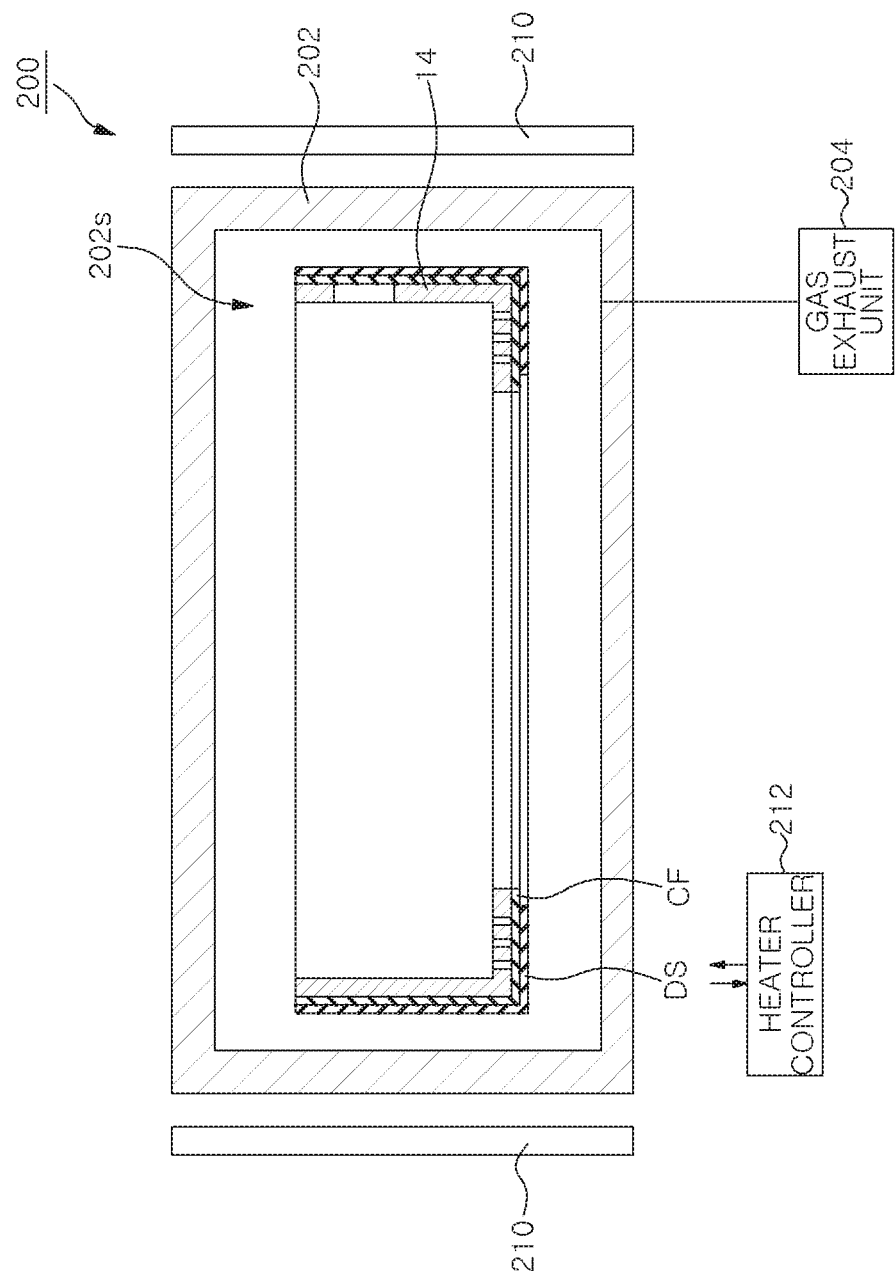
FIG. 10 shows the state of the component of the plasma processing apparatus after execution of a step ST2 of the cleaning method shown in FIG. 1.
Figure 11:
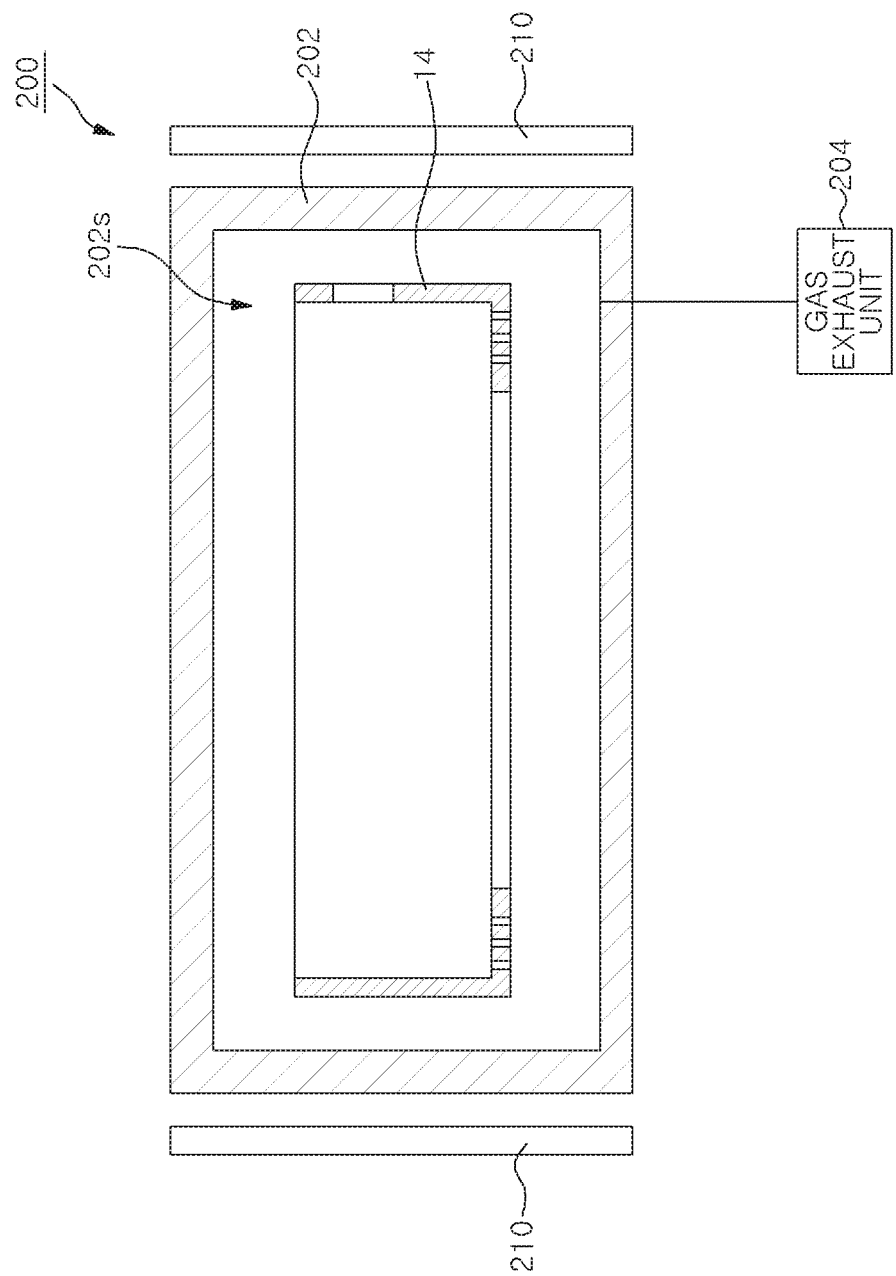
FIG. 11 shows the state of the component of the plasma processing apparatus after execution of a step ST3 of the cleaning method shown in FIG. 1.

Hereinafter, the case in which the method MT is performed to clean the partition wall 14 that is an example of the components of the plasma processing apparatus 10 will be described as an example. In the following description, FIGS. 1 and 3 to 11 will be referred to. FIGS. 3, 4, 10 and show the states of the components of the plasma processing apparatus after the execution of the steps STa, ST1, ST2 and ST3 of the method MT, respectively. FIGS. 5 to 9 show the states of the plasma processing apparatus after the execution of the steps STb, STc, STd, SP and STe of the method MT, respectively.

As described above, in the step ST1 of the method MT, the film is formed on the surfaces of the components of the plasma processing apparatus 10. In the step ST1, the film may be formed on the surfaces of the components in the processing chamber 11, or may be formed on the surfaces of the components in a film forming chamber different from the processing chamber 11. In the former case, i.e., if the film is formed on the surfaces of the components in the processing chamber, the step STa is not required. In the latter case, i.e., if the film is formed on the surfaces of the components in the film forming chamber, the step STa is executed. In the step STa, the component of the plasma processing apparatus 10 is disposed in an inner space 102s defined by a film forming chamber 102 of a film forming module 100. In one example, as shown in FIG. 3, the partition wall 14 is provided in the inner space 102s. As shown in FIG. 3, the film forming module 100 includes the film forming chamber 102, a gas exhaust unit 104, gas supply units 106 and 108, and a heater 110.

The gas exhaust unit 104 includes a pressure control valve and a depressurization pump. The depressurization pump is connected to the inner space 102s via a pressure control valve. The depressurization pump may be a turbo molecular pump and/or a dry pump.

The gas supply unit 106 includes a gas source 106s, a valve 106a, a flow rate controller 106b, and a valve 106c. The gas source 106s is the source of one of the first gas and the second gas. The flow rate controller 106b is a mass flow controller or a pressure control type flow controller. The gas source 106s is connected to the inner space 102s via the valve 106a, the flow rate controller 106b and the valve 106c. The gas from the gas supply unit 106 is supplied into the inner space 102s.

The gas supply unit 108 includes a gas source 108s, a valve 108a, a flow rate controller 108b, and a valve 108c. The gas source 108s is the source of the other one of the first gas and the second gas. The flow rate controller 108b is a mass flow controller or a pressure control type flow controller. The gas source 108s is connected to the inner space 102s via the valve 108a, the flow rate controller 108b and the valve 108c. The gas from the gas supply unit 108 is supplied into the inner space 102s.

Power is supplied from a heater controller 112 to the heater 110. When the power is supplied from the heater controller 112, the heater 110 generates heat to heat the film forming chamber 102 and a substance in the film forming chamber 102. The heater 110 is provided outside the film forming chamber 102.

Next, the step ST1 of the method MT is executed. In the step ST1, a film CF is formed on the surfaces of the components of the plasma processing apparatus 10. In one example, a film CF is formed on the surface of the partition wall 14. When the film CF is formed in the inner space S of the processing chamber 11, one of the first gas and the second gas is supplied from the gas supply unit 40 into the inner space S, and the other one of the first gas and the second gas is supplied from the gas supply unit 42 into the inner space S. When the film CF is formed in the film forming chamber 102 as shown in FIG. 4, one of the first gas and the second gas is supplied from the gas supply unit 106 into the inner space 102s, and the other one of the first gas and the second gas is supplied from the gas supply unit 108 into the inner space 102s.

The first gas contains a first compound. The second gas contains a second compound. The first compound, which is a raw material monomer, is isocyanate. The second compound, which is a raw material monomer, is amine or a compound having a hydroxyl group. In the step ST1, polymerization of the first compound and the second compound occurs. Due to the polymerization of the first compound and the second compound, a compound forming the film CF is generated. When the second compound is amine, the compound forming the film CF may be oligomer or polymer having a urea bond. When the second compound is a compound having a hydroxyl group, the compound forming the film CF may be oligomer or polymer having a urethane bond.

The polymerization of the first compound and the second compound occurs at a temperature lower than the temperature at which depolymerization of the compound forming the film CF occurs. The polymerization of the first compound and the second compound occurs within a temperature range of 0° C. to 150° C., for example. In the step ST2, a temperature in the space where the component is disposed is set to be within the above-described range. When the film CF is formed in the film forming chamber 102, the heater 110 may be used to set the temperature in the step ST2. Alternatively, at least one of the heater 110, a heater in a stage in the inner space 102s of the film forming chamber 102, a non-contact heater (e.g., lamp heater) provided in the inner space 102s, and a heater embedded in the film forming chamber 102 may be used to set the temperature in the step ST2. When the film CF is formed in the processing chamber 11, at least one of the heater 72, one or more heaters in the electrostatic chuck 20, a non-contact heater (e.g., lamp heater) provided in the inner space S, a heater embedded in the chamber body 12, and a heater embedded in the upper electrode 30 may be used to set the temperature in the step ST2.

Hereinafter, examples of the first compound, the second compound, and the compound forming the film CF will be described. As for the first compound, monofunctional isocyanate shown in the following formula (1) or bifunctional isocyanate shown in the following formula (2) may be used. In the formulas (1) and (2), R represents a saturated hydrocarbon group such as an alkyl group (linear alkyl group or cyclic alkyl group), an unsaturated hydrocarbon group such as an aryl group or the like, or a group containing a hetero atom such as N, O, S, F, Si or the like. The group containing a hetero atom includes a saturated hydrocarbon group or an unsaturated hydrocarbon group whose elements are partially substituted with N, O, S, F, Si, or the like. Hydrogen in C—H bond contained in the atomic group represented by R in the formulas (1) and (2) may be substituted with another substituent. As for the isocyanate that is the first compound, an aliphatic compound or an aromatic compound may be used, for example. As for the aliphatic compound, an aliphatic chain compound or an aliphatic cyclic compound may be used. The aliphatic compound may include, e.g., hexamethylene diisocyanate. The aliphatic cyclic compound may include, e.g., 1,3-bis (isocyanatomethyl) cyclohexane (H6XDI).

[Formula 1]

OCN—R  (1)

[Formula 2]

OCN—R—NCO  (2)

As for the second compound, monofunctional amine shown in the following formula (3) or bifunctional amines shown in the following formula (4) may be used. In the formulas (3) and (4), R represents a saturated hydrocarbon group such as an alkyl group (linear alkyl group or a cyclic alkyl group) or the like, an unsaturated hydrocarbon group such as an aryl group or the like, or a group containing a hetero atom such as N, O, S, F, Si or the like. The group containing a hetero atom includes a saturated hydrocarbon group or an unsaturated hydrocarbon group whose elements are partially substituted with N, O, S, F, Si, or the like. Hydrogen in C—H bond contained in the atomic group represented by R in the formulas (3) and (4) may be substituted with another substituent. The atomic group of the first compound polymerized in the step ST1, which is the atomic group represented by R in the formula (1) or (2), may be the same as or different from the atomic group of the second compound polymerized in the step ST1, which is the atomic group represented by R in the formula (3) or (4). As for the amine that is the second compound, an aliphatic compound or an aromatic compound may be used, for example. As for the aliphatic compound, an aliphatic chain compound or an aliphatic cyclic compound may be used. The aliphatic compound may include, e.g., 1,12-diaminododecane (DAD). The aliphatic cyclic compound may include 1,3-bis (aminomethyl) cyclohexane (H6XDA). The amine that is the second compound may be secondary amine.

[Formula 3]

$H_2N$—R  (3)

[Formula 4]

$H_2N$—R—$NH_2$  (4)

As for the second compound, a monofunctional compound having a hydroxyl group shown in the following formula (5) or a bifunctional compound having a hydroxyl group shown in the formula (6) may be used. In the formulas (5) and (6), R represents a saturated hydrocarbon group such as an alkyl group (linear alkyl group or cyclic alkyl group) or the like, an unsaturated hydrocarbon group such as an aryl group or the like, or a group containing a hetero atom such as N, O, S, F, Si or the like. The group containing a hetero atom includes a saturated hydrocarbon group or an unsaturated hydrocarbon group whose elements are partially substituted with N, O, S, F, Si, or the like. Hydrogen in C—H bond contained in the atomic group represented by R in the formulas (5) and (6) may be substituted with another substituent. The atomic group of the first compound polymerized in the step ST1, which is the atomic group represented by R in the formula (1) or (2), may be the same as or different from the atomic group of the second compound polymerized in the step ST1, which is the atomic group represented by R in the formula (5) or (6). The compound having a hydroxyl group is alcohol or phenol. As for the alcohol that is the second compound, diethylene glycol, and 1,2-cyclohexane diol may be used, for example. As for the phenol that is the second compound, hydroquinone, and 1,2,4-trihydroxybenzene may be used, for example.

[Formula 5]

  (5)

[Formula 6]

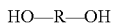  (6)

As for the compound forming the film CF, compounds having a urea bond shown in the following formulas (7) to (10) may be used. The compound shown in the formula (7) is generated by polymerization of the compound shown in the formula (1) and the compound shown in the formula (3). The compound shown in the formula (8) is generated by polymerization of the compound shown in the formula (1) and the compound shown in the formula (4). Alternatively, the compound shown in the formula (8) is generated by polymerization of the compound shown in the formula (2) and the compound shown in the formula (3). The compound shown in the formula (9) is generated by polymerization of the compound shown in the formula (2) and the compound shown in the formula (4). The compound shown in the formula (10) has a structure in which both ends of the polymer shown in the formula (9) are terminated with a monomer having an isocyanate group (e.g., the compound shown in the formula (1)) and a monomer having an amino group (e.g., the compound shown in the formula (3)). In the formulas (9) and (10), n is an integer of 2 or more.

[Formula 7]

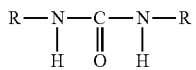  (7)

[Formula 8]

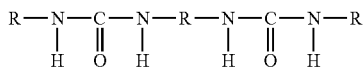  (8)

[Formula 9]

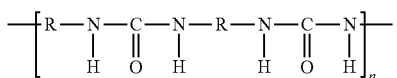  (9)

[Formula 10]

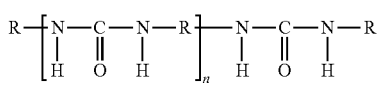  (10)

As for another compound forming the film CF, compounds having a urethane bond shown in the following formulas (11) to (15) may be used. The compound shown in the formula (11) is generated by polymerization of the compound shown in the formula (1) and the compound shown in the formula (5). The compound shown in the formula (12) is generated by polymerization of the compound shown in the formula (1) and the compound shown in the formula (6). The compound shown in the formula (13) is generated by polymerization of the compound shown in the formula (2) and the compound shown in the formula (5). The compound shown in the formula (14) is generated by polymerization of the compound shown in the formula (2) and the compound shown in the formula (6). The compound shown in the formula (15) has a structure in which both ends of the polymer shown in the formula (14) are terminated with a monomer having an isocyanate group (e.g., the compound shown in the formula (1)) and a monomer having a hydroxyl group (e.g., the compound shown in the formula (5)). In the formulas (14) and (15), n is an integer of 2 or more.

[Formula 11]

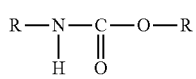  (11)

[Formula 12]

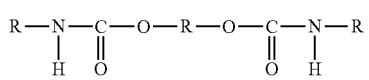  (12)

[Formula 13]

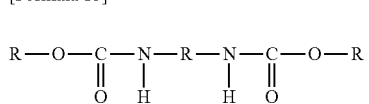  (13)

[Formula 14]

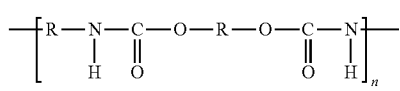  (14)

[Formula 15]

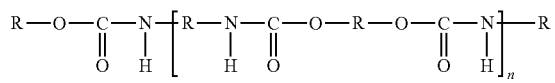  (15)

The following formulas (16) to (26) show examples of the structure of the atomic group represented by R in the formulas (2), (4) and (6). In the formulas (16) to (26), $R^1$ represents an isocyanate group, an amino group, or a hydroxyl group. As shown in the formulas (16) to (22), each of the first compound and the second compound may have a benzene ring as the atomic group represented by R1. Each of the compounds shown in formulas (16) to (19) does not have carbon between the benzene ring and the isocyanate group, the amino group, or the hydroxyl group. Each of the compounds shown in formulas (20) to (22) has carbon between the benzene ring and the isocyanate group, the amino group, or the hydroxyl group. As shown in the formulas (23) and (24), each of the first compound and the second compound may have alicyclic hydrocarbon as the atomic group represented by R. As shown in the formulas (25) and (26), in each of the first compound and the second compound, the atomic group represented by R may be an aliphatic group.

[Formula 16]

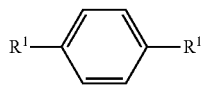  (16)

-continued

[Formula 17]

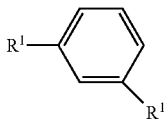
(17)

[Formula 18]

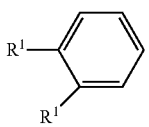
(18)

[Formula 19]

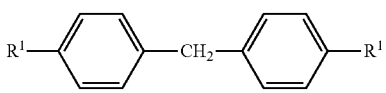
(19)

[Formula 20]

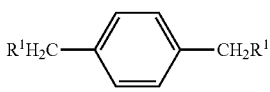
(20)

[Formula 21]

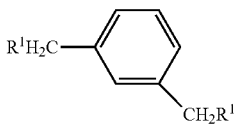
(21)

[Formula 22]

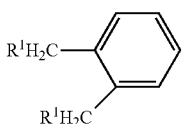
(22)

[Formula 23]

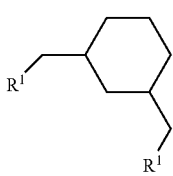
(23)

[Formula 24]

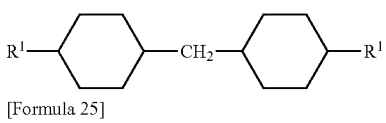
(24)

[Formula 25]

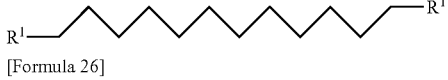
(25)

[Formula 26]

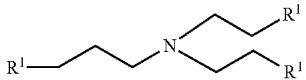
(26)

Figure 5:
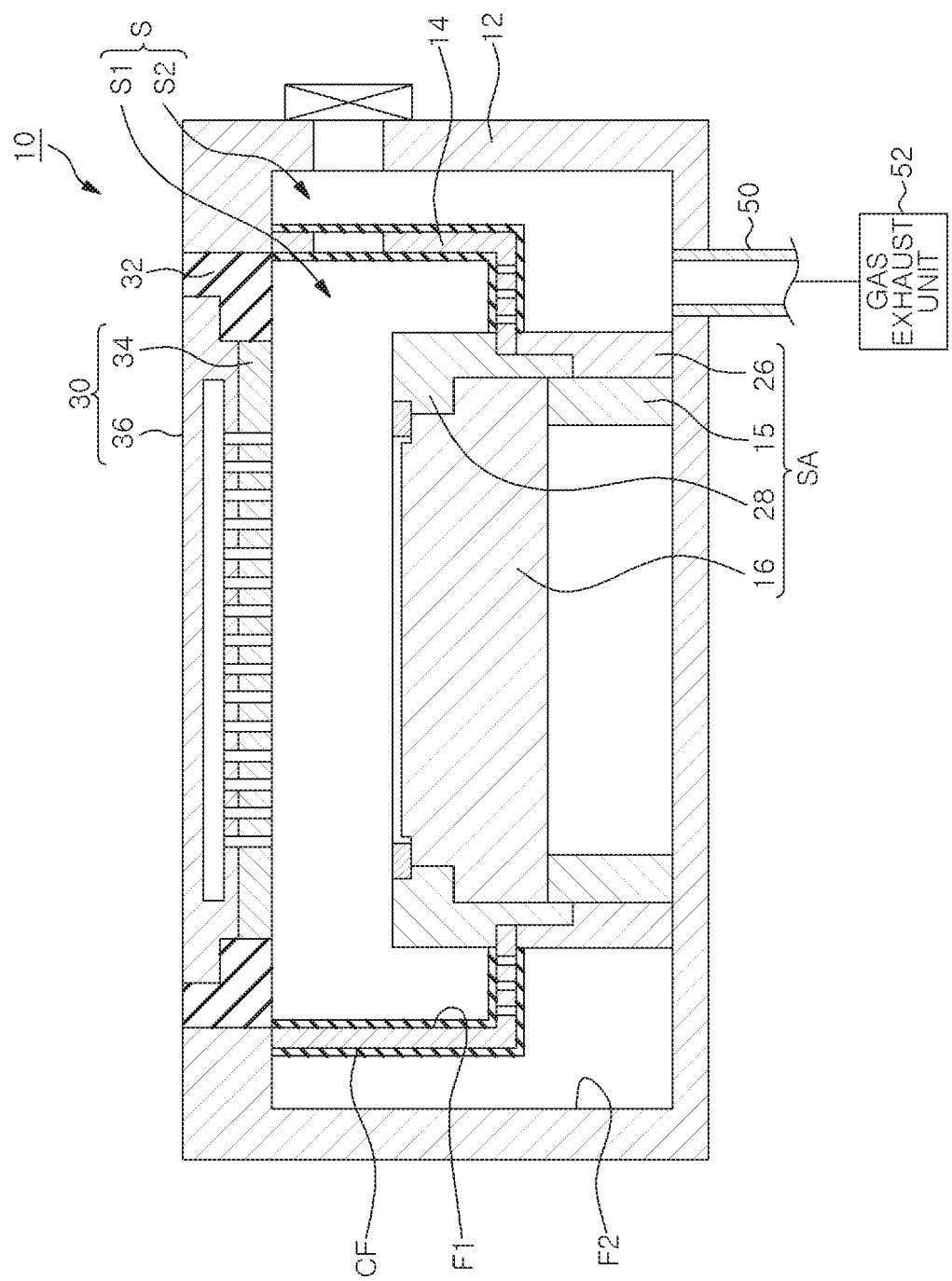
FIG. 5 shows a state of the plasma processing apparatus after execution of a step STb of the cleaning method shown in FIG. 1.

In the case of forming the film CF in the film forming chamber 102, the step STb is executed. In the step STb, the component having the film CF on the surface thereof is disposed at a predetermined position in the inner space S of the chamber body 12. In one example, the partition wall 14 having the film CF on the surface thereof is disposed at a predetermined position in the inner space S, as shown in FIG. 5. The predetermined position in the inner space S where the partition wall 14 is disposed is the position on the boundary between the first space S1 and the second space S2, as described with reference to FIG. 2.

Figure 6:
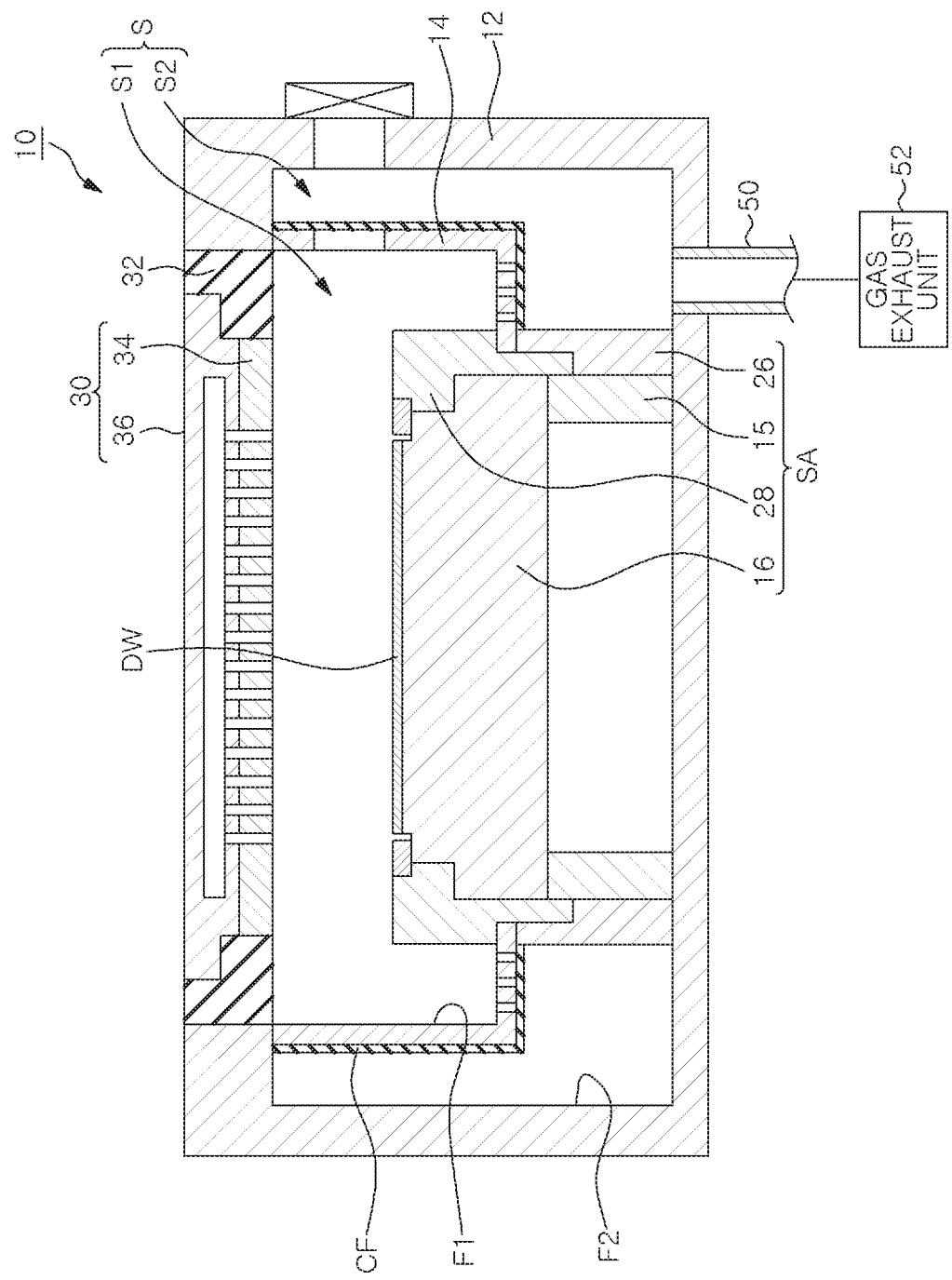
FIG. 6 shows a state of the plasma processing apparatus after execution of a step STc of the cleaning method shown in FIG. 1.

Next, the step STc of the method MT may be executed. The step STc can be executed when the deposit formed on the first surface F1 by the substrate treatment in the step SP can be removed by the plasma cleaning in the step STe. In the step STc, the film CF on the first surface F1 or the film CF on the region of the component which is a part of the first surface F1 is removed. In one example, the film CF formed on the region 14e of the partition wall 14 is removed. In the step STc, plasma of a third gas is generated in the first space S1. The third gas can etch the film CF by active species from the plasma of the third gas. The third gas may contain an oxygen-containing gas such as oxygen gas, carbon monoxide gas, and carbon dioxide gas. Alternatively, the third gas may be a mixed gas containing hydrogen gas and nitrogen gas. In the step STc, the third gas is supplied from the gas supply unit 40 into the first space S1 and the first high frequency power is supplied to the upper electrode 30. In addition, the gas exhaust unit 52 is controlled to set a pressure in the first space S1 to a specified pressure. In the step STc, the film CF on the first surface F1 or the film CF on the region of the component which is a part of the first surface F1 is etched by the active species from the plasma of the third gas. In one example, the film CF on the region 14e of the partition wall 14 is etched. As a result, as shown in FIG. 6, the film CF on the first surface F1 is removed. The step STc may be executed in a state where no object is mounted on the supporting table 16 (the electrostatic chuck 20). Alternatively, the step STc may be executed in a state where the protection member (e.g., dummy substrate DW) is mounted on the supporting table 16 (the electrostatic chuck 20).

Figure 7:
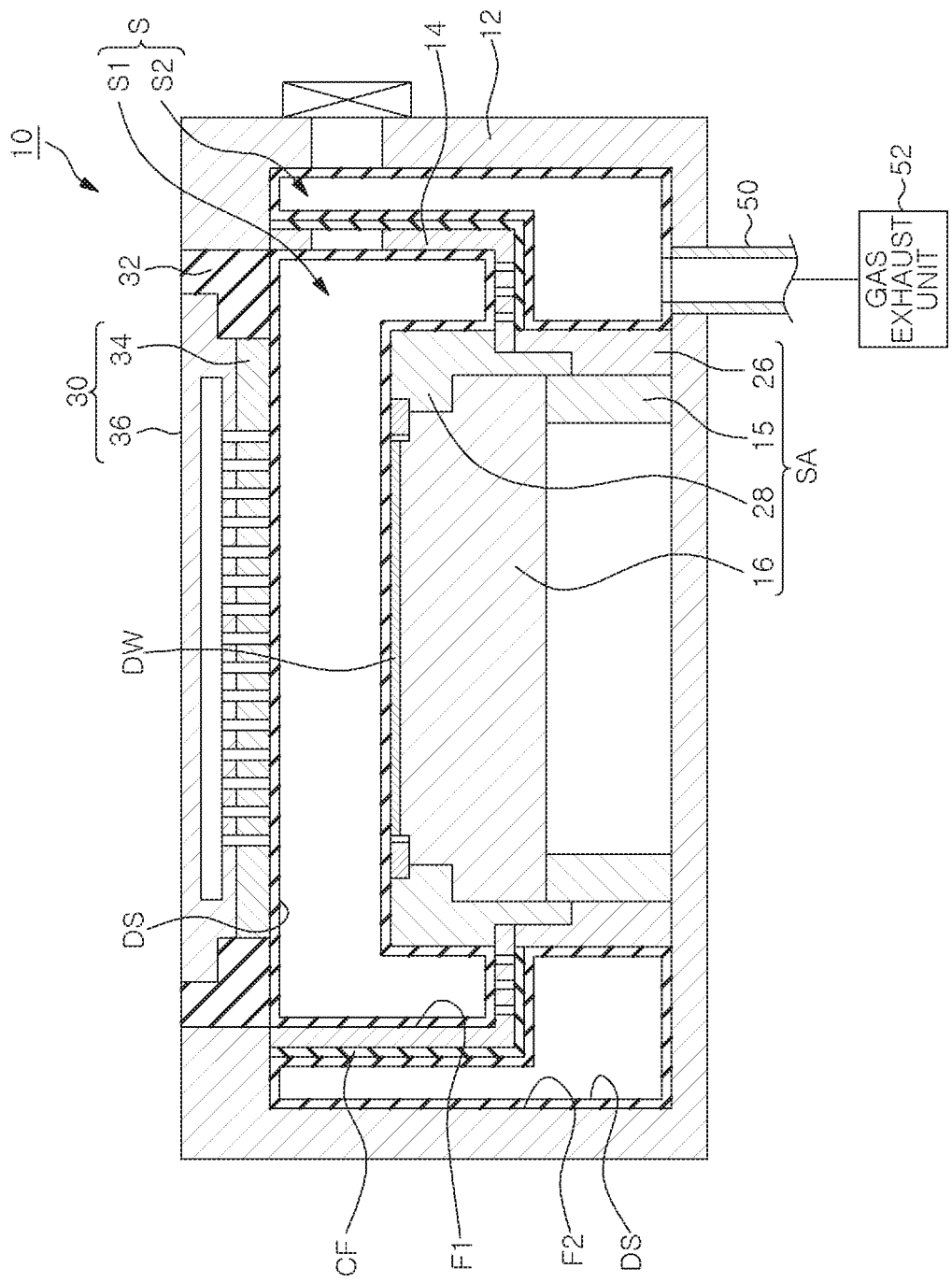
FIG. 7 shows a state of the plasma processing apparatus after execution of a step STd of the cleaning method shown in FIG. 1.

In one embodiment, the step STd is then executed. In the step STd, the same treatment as the substrate treatment in the step SP is performed. In the step STd, only the same treatment as the film formation included in the substrate treatment in the step SP may be performed. The step STd is executed in a state where the protection member (e.g., dummy substrate DW) is mounted on the supporting table 16 (the electrostatic chuck 20). The step STd may be executed multiple times. With respect to the treatment in the step STd, the substrate treatment (or film formation) in the SP is referred to. When the step STd is executed, a deposit DS is formed on the film CF as shown in FIG. 7. When the first surface F1 is exposed, the deposit DS is also formed on the exposed first surface F1. When the second surface F2 is exposed, the deposit DS is also formed on the exposed second surface F2. The deposit DS is a film formed by the film formation and/or an etching by-product.

Next, the step SP of the method MT is executed. In the step SP, the substrate treatment is performed in a state where the substrate W is mounted on the supporting table 16 (the electrostatic chuck 20). The substrate treatment in the step SP includes at least one of film formation and etching. The substrate treatment in the step SP may include film formation and etching performed after the film formation. The film formation may be performed by a chemical vapor deposition method (CVD method), a plasma enhanced CVD (PECVD) method, an atomic layer deposition method (ALD method), or a plasma enhanced ALD Method (PEALD method). The etching included in the substrate treatment in the step SP includes plasma etching. The film in the substrate W which is etched by the plasma etching may be any film. The film in the substrate W which is etched by the plasma etching may be a silicon-containing film or a metal-containing film.

The substrate treatment in the step SP is performed at a temperature at which depolymerization of the compound forming the film CF does not occur. The compound forming the film CF is depolymerized by heating the film CF (or the component of the plasma processing apparatus 10). The depolymerization is reverse reaction of the polymerization. During the depolymerization, the compound forming the forming the film CF is decomposed into the first compound and the second compound. The temperature at which the depolymerization of the compound forming the film CF occurs is within a range of 200° C. to 350° C., for example.

Figure 8:
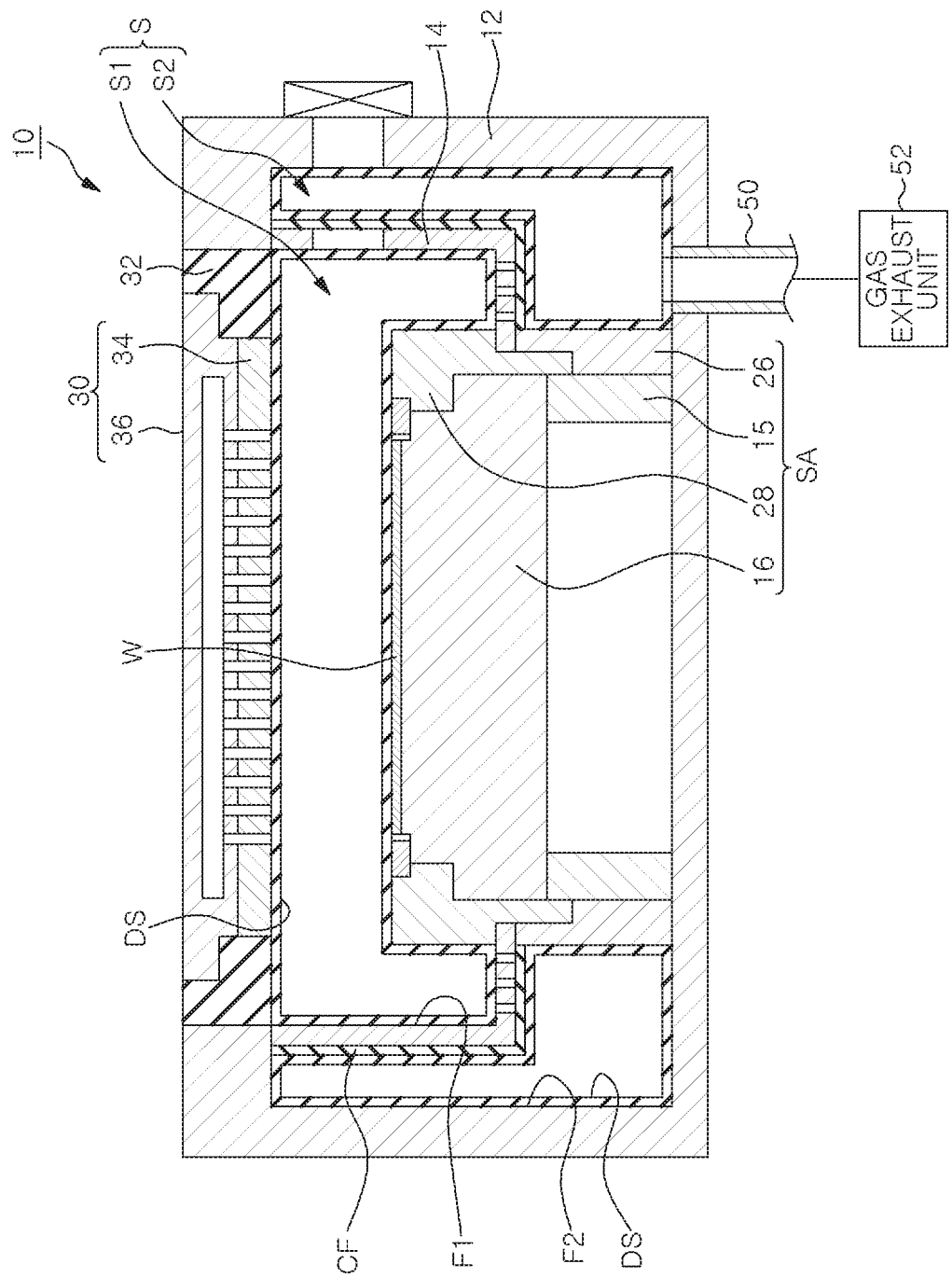
FIG. 8 shows a state of the plasma processing apparatus after execution of a step SP of the cleaning method shown in FIG. 1.

When the step SP is executed, the deposit DS is formed on the film CF, as shown in FIG. 8. When the first surface F1 is exposed, the deposit DS is also formed on the exposed first surface F1. When the second surface F2 is exposed, the deposit DS is also formed on the exposed second surface F2. The deposit DS is a film formed by the film formation and/or an etching by-product. The deposit DS may be made of any material. The deposit DS is made of, e.g., silicon oxide or tungsten. The step SP may be sequentially executed for a plurality of substrates W. After the execution of the step SP, the substrate W is unloaded from the inner space S.

Next, the step STe of the method MT may be executed. In the step STe, the deposit DS on the first surface F1 is removed. In the step STe, plasma of a fourth gas is generated in the first space S1. The fourth gas may be any gas that can etch the deposit DS by active species from the plasma of the fourth gas. When the deposit DS is made of silicon oxide or tungsten, the fourth gas contains, e.g., a fluorocarbon gas. In the step STe, the fourth gas is supplied from the gas supply unit 40 into the first space S1 and the first high frequency power is supplied to the upper electrode 30. Further, the gas exhaust unit 52 is controlled to set a pressure in the first space S1 to a specified pressure. In the step STe, the deposit DS formed on the first surface F1 is etched by the active species from the plasma of the fourth gas. As a result, as shown in FIG. 9, the deposit DS on the first surface F1 is removed. The step STe may be executed in a state where no object is mounted on the supporting table 16 (the electrostatic chuck 20). Alternatively, the step STe may be executed in a state where the protection member (e.g., dummy substrate DW) is mounted on the supporting table 16 (the electrostatic chuck 20).

Next, the step ST2 of the method MT is executed. In the step ST2, as shown in FIG. 10, the component of the plasma processing apparatus 10 which needs to be cleaned is disposed in an inner space 202s of a heating chamber 202. In one example, the partition wall 14 is disposed in the inner space 202s of the heating chamber 202. As shown in FIG. 10, the heating module 200 includes the heating chamber 202, a gas exhaust unit 204, and a heater 210.

The gas exhaust unit 204 includes a pressure control valve and a depressurization pump. The depressurization pump is connected to the inner space 202s via a pressure control valve. The depressurization pump may be a turbo molecular pump and/or a dry pump.

Power is applied from a heater controller 212 to the heater 210. When the power is applied from the heater controller 212, the heater 210 generates heat to heat the heating chamber 202 and a substance in the heating chamber 202. The heater 210 is provided outside the heating chamber 202.

Further, the film forming module 100 may be used as the heating module 200. In other words, the heating chamber 202 may be the film forming chamber 102. In that case, in the step ST2, the component of the plasma processing apparatus 10 which needs to be cleaned is disposed in the inner space 102s of the film forming chamber 102.

Next, the step ST3 of the method MT is executed. In the step ST3, the deposit DS formed on the film CF is removed together with the film CF formed on the component. In the step ST3, the component is heated so that the depolymerization of the compound forming the film CF occurs. As described above, the depolymerization of the compound forming the film CF occurs at a temperature of 200° C. to 350° C., for example. As least one of the heater 210, a heater embedded in a stage provided in the inner space 202s of the heating chamber 202, a heater embedded in the heating chamber 202, and a non-contact heater (e.g., lamp heater) provided in the inner space 202s of the heating chamber 202 is used for the heating in the step ST3. When the film forming module 100 is used as the heating module 200, at least one of the heater 110, a heater embedded in a stage provided in the inner space 102s of the film forming chamber 102, a heater embedded in the film forming chamber 102, and a non-contact heater (e.g., lamp heater) provided in the inner space 102s of the film forming chamber 102 is used for the heating in the step ST3.

Next, the step ST3 of the method MT is executed. In the step ST3, the deposit DS on the film CF is removed together with the film CF formed on the component. In the step ST3, the component is heated so that the depolymerization of the compound forming the film CF occurs. As described above, the depolymerization of the compound forming the film CF occurs at a temperature of 200° C. to 350° C., for example. At least one of the heater 210, a heater embedded in a stage provided in the inner space 202s of the heating chamber 202, a heater embedded in the heating chamber 202, and a non-contact heater (e.g., lamp heater) provided in the inner space 202s of the heating chamber 202 is used for the heating in the step ST3. When the film forming module 100 is used as the heating module 200, at least one of the heater 110, a heater embedded in a stage provided in the inner space 102s of the film forming chamber 102, a heater embedded in the film forming chamber 102, and a non-contact heater (e.g., lamp heater) provided in the inner space 102s of the film forming chamber 102 is used for the heating in the step ST3.

In the method MT, the film CF is formed on the surface of the component (e.g., the partition wall 14) of the plasma processing apparatus 10 before the substrate treatment is executed in the processing chamber. The compound forming the film CF is generated by polymerization of isocyanate and amine or by polymerization of isocyanate and a compound having a hydroxyl group. In the method MT, the component is heated in the heating chamber so that depolymerization of the compound forming the film CF occurs, to thereby remove the deposit DS formed on the surface of the component via the film CF. Accordingly, the deposit DS formed on the film CF is removed from the surface of the component together with the film CF. Therefore, in accordance with the method MT, it is possible to remove the deposit DS by a process different from the plasma cleaning.

In the step STc of method MT according to one embodiment, the film CF extending on the first surface F1 is removed as described above. Even when the deposit DS formed on the first surface F1 that defines the first space S1 can be removed by the plasma cleaning, it is difficult to remove the deposit DS formed on the second surface F2 that defines a space where the active species from the plasma hardly reaches, i.e., the second space S2, by the plasma cleaning. In accordance with the present embodiment, the film CF remains on the second surface F2 and, thus, the deposit DS formed on the second surface F2 via the film CF can be removed without using the plasma cleaning.

The deposit DS that cannot be removed by the plasma cleaning can be removed by wet cleaning using chemicals. In the wet cleaning, the component of the plasma processing apparatus on which the deposit DS to be removed is formed is damaged and, thus, the exchange frequency of the component is increased. On the other hand, in the method MT, the deposit DS can be removed by heating. Therefore, the damage inflicted to the component of the plasma processing apparatus is suppressed, and the exchange frequency of the component is decreased.

In one embodiment, as described above, the step STd is executed before the substrate treatment in the step SP is executed. In the step STd, the deposit DS is formed by the same treatment as the substrate treatment in the step SP, and the inner space S is surrounded by the deposit DS. Therefore, during the execution of the step SP, the change in the material of the surface surrounding the inner space S is suppressed. As a result, even if the substrate treatment in the step SP is sequentially executed for a plurality of substrates W, the variation in the substrate treatment for a plurality of substrates W is suppressed.

Figure 12:
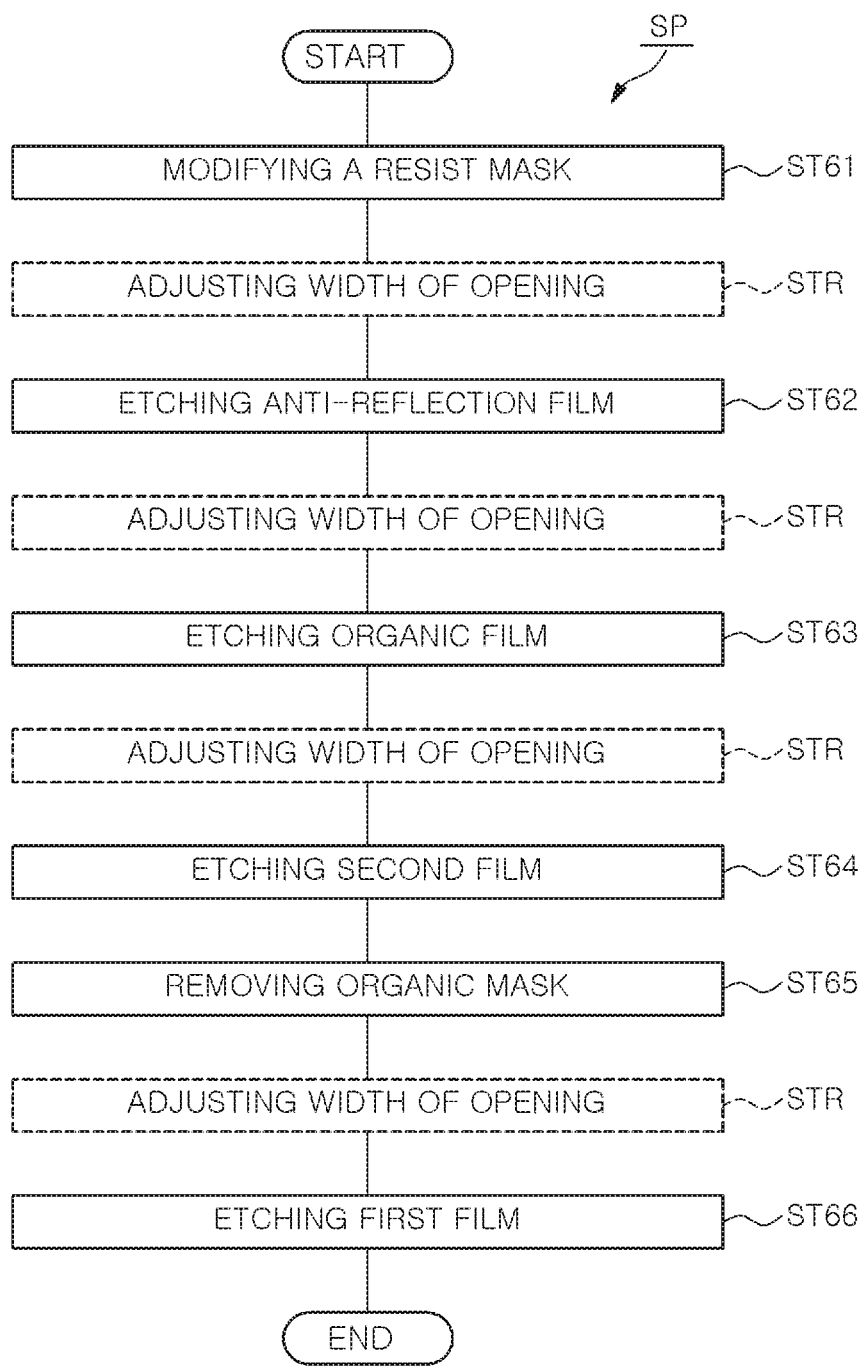
FIG. 12 is a flowchart showing an example of substrate treatment in the step SP of the cleaning method shown in FIG. 1.

Hereinafter, an example of the substrate treatment executed in the step SP will be described. FIG. 12 is a flowchart showing an example of the substrate treatment in the step SP in the cleaning method shown in FIG. 1. The substrate treatment in the step SP shown in FIG. 12 includes steps ST61 to ST66 and a step STR. In the step STR, a width of an opening of a mask is adjusted. The step STR is executed to adjust the width of the opening of the mask for plasma etching in at least one of the steps ST62, ST63, ST64 and ST66.

Figure 13:
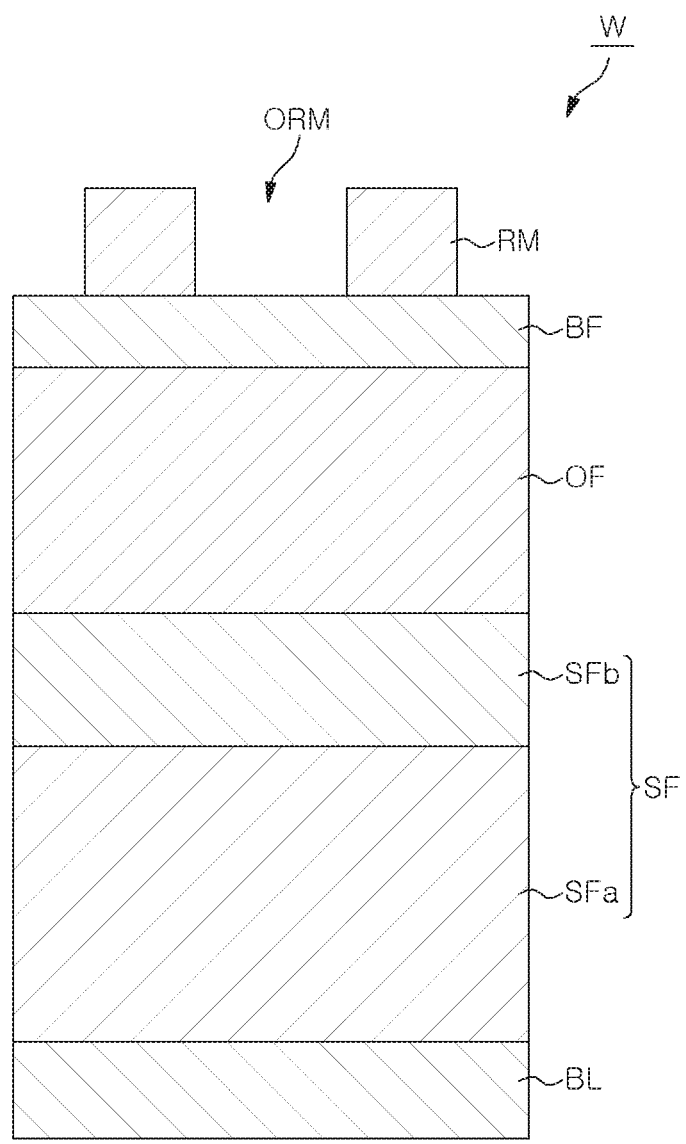
FIG. 13 is a partially enlarged cross sectional view of an example of a substrate to which the substrate treatment shown in FIG. 12 can be applied.

FIG. 13 is a partially enlarged cross sectional view of an example of a substrate to which the substrate treatment shown in FIG. 10 can be applied. The substrate W shown in FIG. 13 may have a substantially disc shape. In one embodiment, the substrate W includes a silicon-containing film SF, an organic film OF, an anti-reflection film BF, and a resist mask RM. The silicon-containing film SF is provided on a base layer BL. In one embodiment, the silicon-containing film SF includes a first film SFa and a second film SFb. The first film SFa is provided on the base layer BL, and the second film SFb is provided on the first film SFa. The first film SFa and the second film SFb contain silicon and are made of different materials. The first film SFa is made of, e.g., silicon. The first film SFa may be a polycrystalline silicon film or an amorphous silicon film. The second film SFb is made of, e.g., silicon oxide.

The organic film OF is provided on the silicon-containing film SF. The anti-reflection film BF is provided on the organic film OF. The anti-reflection film BF contains silicon. The resist mask RM is provided on the anti-reflection film BF. The resist mask RM has a pattern to be transferred to the anti-reflection film BF by plasma etching. In other words, the resist mask RM provides an opening ORM. The opening ORM is a groove or a hole, and partially exposes the surface of the anti-reflection film BF. The resist mask RM can be formed by patterning the resist film by a photolithography technique.

Figure 14A:
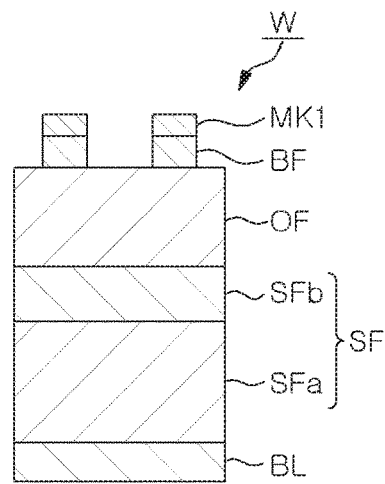
FIGS. 14A to 14D are partially enlarged cross sectional views of the substrate obtained during the execution of the example of substrate treatment in the step SP.
Figure 14B:
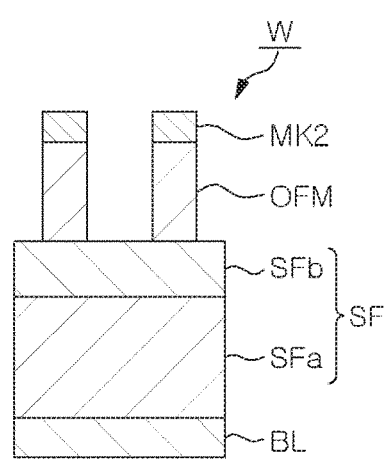
Figure 14C:
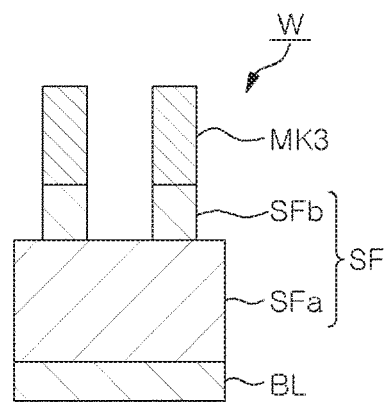
Figure 14D:
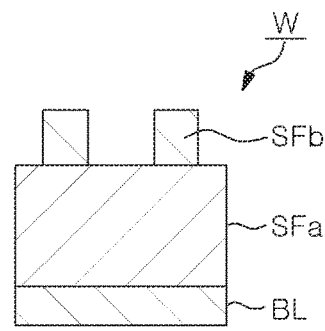
Figure 14E:
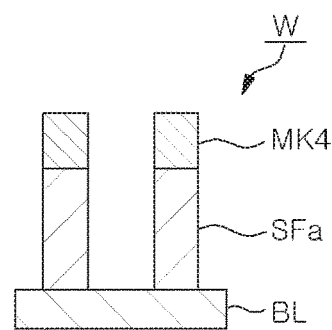
FIG. 14E is a partially enlarged cross sectional view of the substrate after execution of the example of the substrate treatment in the step SP.

Hereinafter, FIGS. 12 and 14A to 14E will be referred to. FIGS. 14A to 14D are partially enlarged cross sectional views of the substrate obtained during the execution of the example of the substrate treatment in the step SP. FIG. 14E is a partially enlarged cross sectional view of the substrate after the execution of the example of the substrate treatment in the step SP.

As shown in FIG. 12, in one example of the substrate treatment in the step SP, the step ST61 is executed. In the step ST61, the resist mask RM is modified. Specifically, in the step ST61, a processing gas is supplied into the first space S1 in a state where the substrate W shown in FIG. 13 is mounted on the supporting table 16 (the electrostatic chuck 20). The processing gas used in the step ST61 may be, e.g., a mixed gas of hydrogen gas and rare gas. In the step ST61, the gas exhaust unit 52 is controlled to set a pressure in the first space S1 to a specified pressure. In the step ST61, the first high frequency power from the first high frequency power supply 61 is supplied to the upper electrode 30. In the step ST61, a voltage from the DC power supply 70 is applied to the upper electrode 30. In the step ST61, the second high frequency power from the second high frequency power supply 62 may be supplied to the lower electrode 18 or may not be supplied. By executing the step ST61, plasma of the processing gas is generated in the first space S1. Positive ions in the plasma collide with the ceiling plate 34 of the upper electrode 30. As a result, secondary electrons are emitted from the ceiling plate 34. The resist mask RM is modified by the emitted secondary electrons.

In an example of the substrate treatment in the step SP, the step ST62 is executed after the step ST61. In the step ST62, plasma etching is performed to transfer the pattern of the mask MK1 to the anti-reflection film BF. The mask MK1 is the resist mask RM or a mask obtained by adjusting the width of the opening of the resist mask RM in the step STR.

In the step ST62, the processing gas is supplied into the first space S1 in a state where the substrate W having the mask MK1 is mounted on the supporting table 16 (the electrostatic chuck 20). The processing gas used in the step ST62 may contain, e.g., a fluorocarbon gas. In the step ST62, the gas exhaust unit 52 is controlled to set a pressure in the first space S1 to a specified pressure. In the step ST62, the first high frequency power from the first high frequency power supply 61 is supplied to the upper electrode 30. In the step ST62, the second high frequency power from the second high frequency power supply 62 is supplied to the lower electrode 18. By executing the step ST62, plasma of the processing gas is generated in the first space S1. Then, the anti-reflection film BF is etched by active species such as ions and/or radicals in the plasma. As a result, as shown in FIG. 14A, the pattern of the mask MK 1 is transferred to the anti-reflection film BF. After the step ST62 is executed, the mask MK1 may be removed.

In an example of the substrate treatment in the step SP, the step ST63 is executed after the step ST62. In the step ST63, plasma etching is performed to transfer the pattern of the mask MK2 to the organic film OF. The mask MK2 is a mask obtained from the anti-reflection film BF by the plasma etching in the step ST62 or a mask obtained by adjusting the width of the mask obtained from the anti-reflection film BF in the step STR.

In the step ST63, the processing gas is supplied into the first space S1 in a state where the substrate W having the mask MK2 is mounted on the supporting table 16 (the electrostatic chuck 20). The processing gas used in the step ST63 contains oxygen-containing gas (e.g., oxygen gas). Alternatively, the processing gas used in the step ST63 includes hydrogen gas and nitrogen gas. In the step ST63, the gas exhaust unit 52 is controlled to set a pressure in the first space S1 to a specified pressure. In the step ST63, the first high frequency power from the first high frequency power supply 61 is supplied to the upper electrode 30. In the step ST63, the second high frequency power from the second high frequency power supply 62 is supplied to the lower electrode 18. By executing the step ST63, plasma of the processing gas is generated in the first space S1. Then, the organic film OF is etched by active species such as ions and/or radicals in the plasma. As a result, as shown in FIG. 14B, the pattern of the mask MK2 is transferred to the organic film OF, and an organic mask OFM is obtained from the organic film OF. After the step ST63 is executed, the mask MK2 may be removed.

In an example of the substrate treatment in the step SP, the step ST64 is executed after step ST63. In the step ST64, plasma etching is performed to transfer a pattern of a mask MK3 to the second film SFb. The mask MK3 is the organic mask OFM or a mask obtained by adjusting the width of the opening of the organic mask OFM in the step STR.

In the step ST64, the processing gas is supplied into the first space S1 in a state where the substrate W having the mask MK3 is mounted on the supporting table 16 (the electrostatic chuck 20). The processing gas used in the step ST64 may contain a fluorocarbon gas. In the step ST64, the gas exhaust unit 52 is controlled to set a pressure in the first space S1 to a specified pressure. In the step ST64, the first high frequency power from the first high frequency power supply 61 is supplied to the upper electrode 30. In step ST64, the second high frequency power from the second high frequency power supply 62 is supplied to the lower electrode 18. By executing the step ST64, plasma of the processing gas is generated in the first space S1. Then, the second film SFb is etched by active species such as ions and/or radicals in the plasma. As a result, as shown in FIG. 14C, the pattern of the mask MK3 is transferred to the second film SFb.

In an example of the substrate treatment in the step SP, the step ST65 is then executed. In the step ST65, the mask MK3 is removed. In the step ST65, the processing gas is supplied to the first space S1 in a state where the substrate W shown in FIG. 14C is mounted on the supporting table 16 (the electrostatic chuck 20). The processing gas used in the step ST65 contains oxygen-containing gas (e.g., oxygen gas). Alternatively, the processing gas used in the step ST65 contains hydrogen gas and nitrogen gas. In the step ST65, the gas exhaust unit 52 is controlled to set a pressure in the first space S1 to a specified pressure.

In the step ST65, the first high frequency power from the first high frequency power supply 61 is supplied to the upper electrode 30. In the step ST65, the second high frequency power from the second high frequency power supply 62 may be supplied to the lower electrode 18, or may not be supplied. By executing the step ST65, plasma of the processing gas is generated in the first space S1. Then, the mask MK3, i.e., the organic mask OFM itself or the mask including the organic mask OFM, is removed by active species such as ions and/or radicals in the plasma. As a result, the substrate W shown in FIG. 14D is obtained.

In an example of the substrate treatment in the step SP, the step ST66 is executed after the step ST65. In the step ST66, plasma etching is performed to transfer a pattern of a mask MK4 to the first film SFa. The mask MK4 is a mask obtained from the second film SFb by the plasma etching in the step ST64, or a mask obtained by adjusting the width of the mask obtained from the second film SFb in the step STR.

In the step ST66, the processing gas is supplied into the first space S1 in a state where the substrate W having the mask MK4 is mounted on the supporting table 16 (the electrostatic chuck 20). The processing gas used in the step ST66 may include halogen-based gas. The processing gas used in the step ST66 may include, e.g., at least one of chlorine gas and hydrogen bromide gas. In the step ST66, the gas exhaust unit 52 is controlled to set a pressure in the first space S1 to a specified pressure. In the step ST66, the first high frequency power from the first high frequency power supply 61 is supplied to the upper electrode 30. In the step ST66, the second high frequency power from the second high frequency power supply 62 is supplied to the lower electrode 18. By executing the step ST66, plasma of the processing gas is generated in the first space S1. Then, the first film SFa is etched by active species such as ions and/or radicals in the plasma. Accordingly, as shown in FIG. 14E, the pattern of the mask MK4 is transferred to the first film SFa. The plasma etching may be performed to remove the oxide film formed on the surface of the first film SFa before the execution of the step ST66. A fluorocarbon gas may be used for the plasma etching for removing the oxide film.

Figure 15:
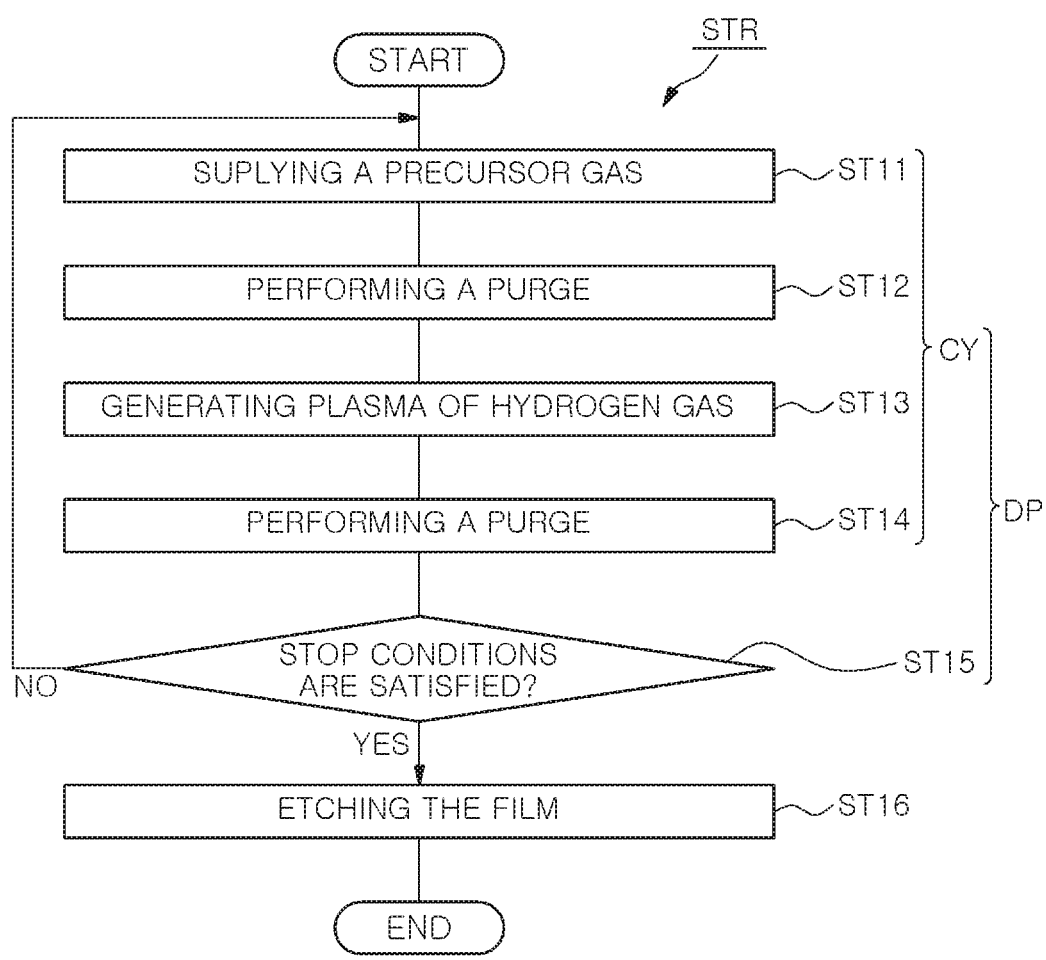
FIG. 15 is a flowchart showing an example of a step STR shown in FIG. 12.
Figure 16A:
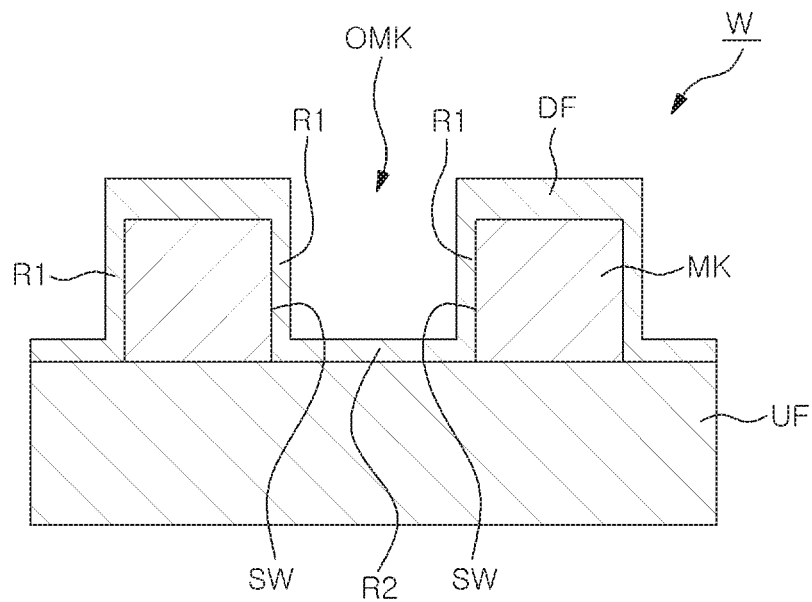
FIG. 16A is a partially enlarged cross sectional view of a substrate after film formation in the step STR.
Figure 16B:
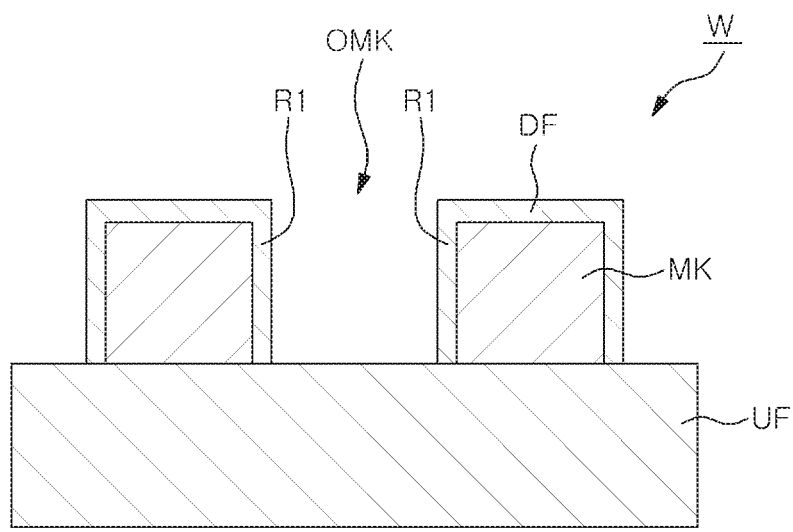
FIG. 16B is a partially enlarged cross sectional view of the substrate after etching of a film in the step STR.

Hereinafter, the step STR will be described with reference to FIGS. 15, 16A and 16B. FIG. 15 is a flowchart showing an example of the step STR shown in FIG. 12. FIG. 16A is a partially enlarged cross sectional view of the substrate after the film formation in the step STR. FIG. 16B is a partially enlarged cross sectional view of the substrate after the etching of the film in the step STR.

The step STR includes film formation DP. The film formation DP is an example of the film formation included in the substrate treatment in the step SP, and is performed by the PEALD method. By performing the film formation DP, as shown in FIG. 16A, the film DF is formed on the surface of the substrate W, i.e., on the surface of the mask MK and the surface of an underlying film UF. The mask MK is a resist mask RM, a mask formed from the anti-reflection film BF by executing the step ST62, an organic mask OFM, or a mask formed from the second film SFb by executing the step ST64. When the mask MK is the resist mask RM, the anti-reflection film BF serves as the underlying film UF. When the mask MK is a mask formed from the anti-reflection film BF by executing the step ST62, the organic film OF serves as the underlying film UF. When the mask MK is the organic mask OFM, the second film SFb serves as the underlying film UF. When the mask MK is a mask formed from the second film SFb by executing the step ST64, the first film Sfa serves as the underlying film UF.

In the film formation DP, a cycle CY is executed at least once to form the film DF. The cycle CY includes the steps ST11 to ST16. In the step ST11, a precursor gas is supplied from the gas supply unit 40 into the first space S1 where the substrate W is provided in order to deposit a precursor on the substrate W. In other words, the precursor gas is supplied to the substrate W. The precursor gas is also supplied into the second space S2 via the first space S1.

When the film DF is a silicon oxide film, the precursor gas is, e.g., an aminosilane-based gas. The aminosilane-based gas may be an organic-containing aminosilane-based gas. As for the aminosilane-based gas, a gas having a molecular structure with a relatively small number of amino groups may be used. For example, monoamino silane ($H_3$—S—R (R being an organic group that contains an organic group and may be substituted)) may be used. The aminosilane-based gas may contain aminosilane having one to three silicon atoms, or may contain aminosilane having one to three amino groups. The aminosilane having one to three silicon atoms may be monosilane (monoaminosilane) having one to three amino groups, disilane having one to three amino groups, or trisilane having one to three amino groups.

The aminosilane may have an amino group that may be substituted. Further, the amino group may be substituted by any of a methyl group, an ethyl group, a propyl group, and a butyl group. The methyl group, the ethyl group, the propyl group, and the butyl group may be substituted with halogen.

When the film DF is a tungsten film, the precursor gas contains tungsten. The precursor gas may be a halogenated tungsten gas. The precursor gas is, e.g., tungsten hexafluoride ($WF_6$) gas. The precursor gas may be another halogenated tungsten gas such as tungsten hexachloride gas, or another tungsten-containing gas.

In the step ST11, no plasma is generated in the first space S1. In other words, in the step ST11, the supply of the first high frequency power and the second high frequency power is stopped. In the step ST11, the gas exhaust unit 52 is controlled to set a pressure in the first space S1 to a specified pressure. In the step ST11, a carrier gas may be supplied together with the precursor gas from the gas supply unit 40 into the first space S1. The carrier gas is also supplied into the second space S2 via the first space S1. The carrier gas may be a rare gas such as He gas, Ne gas, Ar gas, Xe gas, or Kr gas. In one embodiment, the carrier gas may be supplied into the first space S1 and the second space S2 during the execution of the film formation DP. When the step ST11 is executed, the precursor is adsorbed onto the surface of the substrate W. The precursor is also adsorbed onto the first surface F1 or the film CF extending on the first surface F1 and onto the film CF extending on the second surface F2.

Next, in the step ST12, the inner space S is purged. Specifically, in the step ST12, the inner space S is exhausted. In the step ST12, a carrier gas may be supplied as a purge gas into the first space S1 and the second space S2. By executing the step ST12, the precursor gas in the inner space S is discharged, and the precursor excessively deposited on the substrate W is removed.

Next, in the step ST13, a reactant gas that reacts with the precursor is supplied from the gas supply unit 40 into the first space S1. When the film DF is a silicon oxide film, the reactant gas is oxygen-containing gas. The oxygen-containing gas is oxygen gas ($O_2$ gas), carbon monoxide gas, or carbon dioxide gas. When the film DF is a tungsten film, the reactant gas is hydrogen gas ($H_2$ gas).

In the step ST13, plasma of the reactant gas is generated in the first space S1. In the step ST13, the first high frequency power is supplied to the upper electrode 30 in a state where the reactant gas is supplied into the first space S1. Accordingly, plasma of the reactant gas is generated in the first space S1. In the step ST13, the second high frequency power may be supplied to the lower electrode 18. In the step ST13, the gas exhaust unit 52 is controlled to set a pressure in the first space S1 to a specified pressure. In the step ST13, active species from the plasma react with the precursor. When the film DF is a silicon oxide film, the precursor is oxidized by the reaction between active species of oxygen and the precursor. When the film DF is a tungsten film, impurities in the precursor are removed by the reaction between active species of hydrogen and the precursor. When the precursor gas is a halogenated tungsten gas, halogen elements are removed from the precursor by the reaction between the halogen elements in the precursor and hydrogen. The active species, mainly radicals, from the plasma reach the second space S2 from the first space S1. Therefore, the reaction between the active species and the precursor extending on the second surface F2 occurs.

Next, in the step ST14, the inner space S is purged. Specifically, in the step ST14, the inner space S is exhausted. In the step ST14, a carrier gas may be supplied as a purge gas into the first space S1 and the second space S2. By executing the step ST14, the reactant gas in the inner space S is discharged.

Next, in the step ST15, it is determined whether or not stop conditions are satisfied. It is determined that the stop conditions are satisfied when the number of executions of the cycle CY has reached a predetermined number. The predetermined number is greater than or equal to one. If it is determined in the step ST15 that the stop conditions are not satisfied, the cycle CY is executed again. On the other hand, when it is determined in the step ST15 that the stopping conditions are satisfied, the film formation DP is stopped. By performing the film formation DP, a film DF is formed on the surface of the substrate W as shown in FIG. 16A. The film DF formed on the surface of the substrate W includes a first region R1 and a second region R2. The first region R1 extends along a side wall surface SW of the mask MK which defines the opening OMK. The second region R2 extends on the underlying film UF. By performing the film formation DP, the deposit DS made of the same material as that forming the film DF is formed on the first surface F1 and also formed on the film CF extending on the second surface F2.

As shown in FIG. 15, in the step STR, the step ST16 is then executed. In the step ST16, plasma etching of the film DF is performed to remove the second region R2 without removing the first region R1. In the step ST16, the processing gas is supplied into the first space S1 in a state where the substrate W in the state shown in FIG. 16A is mounted on the supporting table 16 (the electrostatic chuck 20). The processing gas used in the step ST16 may contain a fluorocarbon gas. In the step ST16, the gas exhaust unit 52 is controlled to set a pressure in the first space S1 to a specified pressure. In the step ST16, the first high frequency power from the first high frequency power supply 61 is supplied to the upper electrode 30. In the step ST16, anisotropic plasma etching is performed to selectively remove the second region R2 with respect to the first region R1. Therefore, in the step ST16, the second high frequency power from the second high frequency power supply 62 is supplied to the lower electrode 18. By executing the step ST16, plasma of the processing gas is generated in the first space S1. Then, ions in the plasma are attracted into the substrate W, thereby etching the second region R2. As a result, as shown in FIG. 16B, the first region R1 of the film DF remains and the second region R2 is etched. The film DF extending on the upper surface of the mask MK is removed, or the film thickness thereof is reduced.

In the step STR, the film DF is formed on the surface of the substrate W by the deposition of the precursor (step ST11) and the reaction between the active species from the plasma and the precursor (step ST13). Then, in the step ST16, the film DF is etched without removing the first region R1. As a result, the width of the opening OMK of the mask MK is adjusted.

Figure 17:
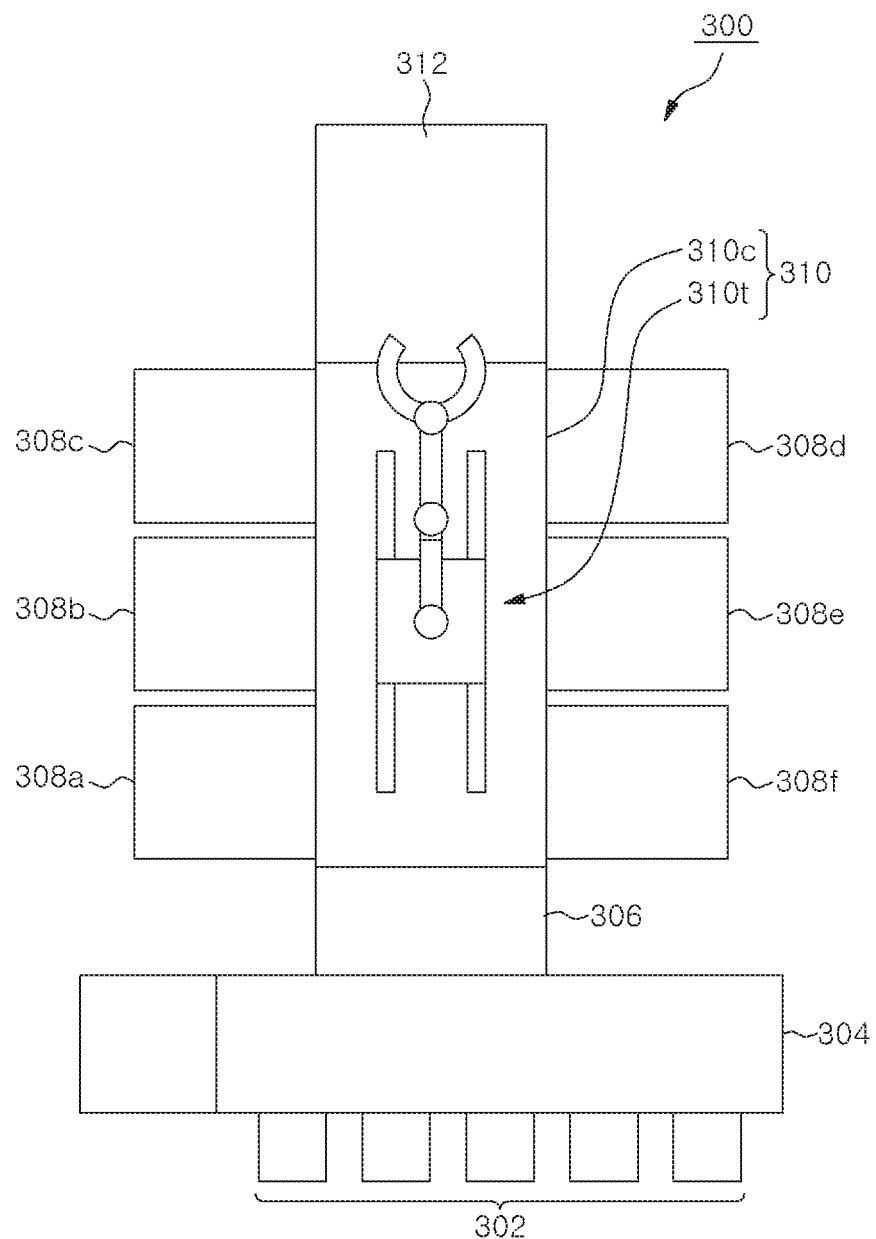
FIG. 17 shows an example of a processing system.

In the steps STa, STb and ST2, the component may be transferred by a transfer mechanism via a depressurizable transfer chamber. Hereinafter, a processing system including the transfer chamber will be described. FIG. 17 shows an example of the processing system. The processing system shown in FIG. 17 includes one or more containers 302, a loader module 304, a load-lock module 306, processing modules 308a to 308f, a transfer module 310, and a module 312.

The containers 302 are disposed along one side of the loader module 304. Each of the containers 302 is configured to accommodate therein a substrate. Each of the containers 302 is, e.g., a FOUP (Front-Opening Unified Pod). The loader module 304 is configured to transfer a substrate under an atmospheric pressure environment. The loader module 304 has a chamber and a transfer mechanism. The load-lock module 306 is connected to the loader module 304 via a gate valve. The transfer mechanism of the loader module 304 transfers the substrate between any one of the containers 302 and the load-lock module 306 via a space in the chamber of the loader module 304. The load-lock module 306 provides a preliminary decompression chamber.

The transfer module 310 has a transfer chamber 310c and a transfer mechanism 310t. The transfer chamber 310c can be depressurized. The transfer chamber 310c is connected to the load-lock module 306 via a gate valve. The transfer chamber 310c is connected to the processing chambers of the processing modules 308a to 308f via gate valves. The transfer chamber 310c is connected to the chamber of the module 312 via a gate valve. The transfer mechanism 310t includes, e.g., a robot arm. The transfer mechanism 310t transfers a substrate between the load-lock module 306 and the processing chamber of any one of the processing modules 308a to 308f and between the processing chambers of any two of the processing modules 308a to 308f.

Each of the processing modules 308a to 308f is a substrate processing apparatus configured to perform dedicated substrate treatment. At least one of the processing modules 308a to 308f is the above-described plasma processing apparatus 10. The transfer mechanism 310t transfers the components of the plasma processing apparatus 10 between the processing chamber of the processing module that is the plasma processing apparatus 10 and the chamber of the module 312. The module 312 serves as the film forming module 100 and also serves as the heating module 200. In other words, the component of the plasma processing apparatus 10 can be transferred by the transfer module 310 between the processing chamber of the plasma processing apparatus 10 and the film forming chamber of the film forming module 100 and between the processing chamber of the plasma processing apparatus 10 and the heating chamber of the heating module 200 without being exposed to the atmospheric environment. The processing system 300 may further include a heating module different from the module 312 that is the film forming module. In that case, the heating chamber of the heating module is connected to the transfer chamber 310c via a gate valve.

In accordance with the processing system 300, in the step STa, the components of the plasma processing apparatus 10 can be transferred from the processing chamber 11 to the film forming chamber 102 by the transfer mechanism 310t via the transfer chamber 310c without being exposed to the atmospheric environment. Further, in accordance with the processing system 300, in the step STb, the components of the plasma processing apparatus 10 can be transferred from the film forming chamber 102 to the processing chamber 11 by the transfer mechanism 310t via the transfer chamber 310c without being exposed to the atmospheric environment. Moreover, in accordance with the processing system 300, in the step ST2, the components of the plasma processing apparatus 10 can be transferred from the processing chamber 11 to the heating chamber 202 by the transfer mechanism 310t via the transfer chamber 310c without being exposed to the atmospheric environment.

Figure 18:
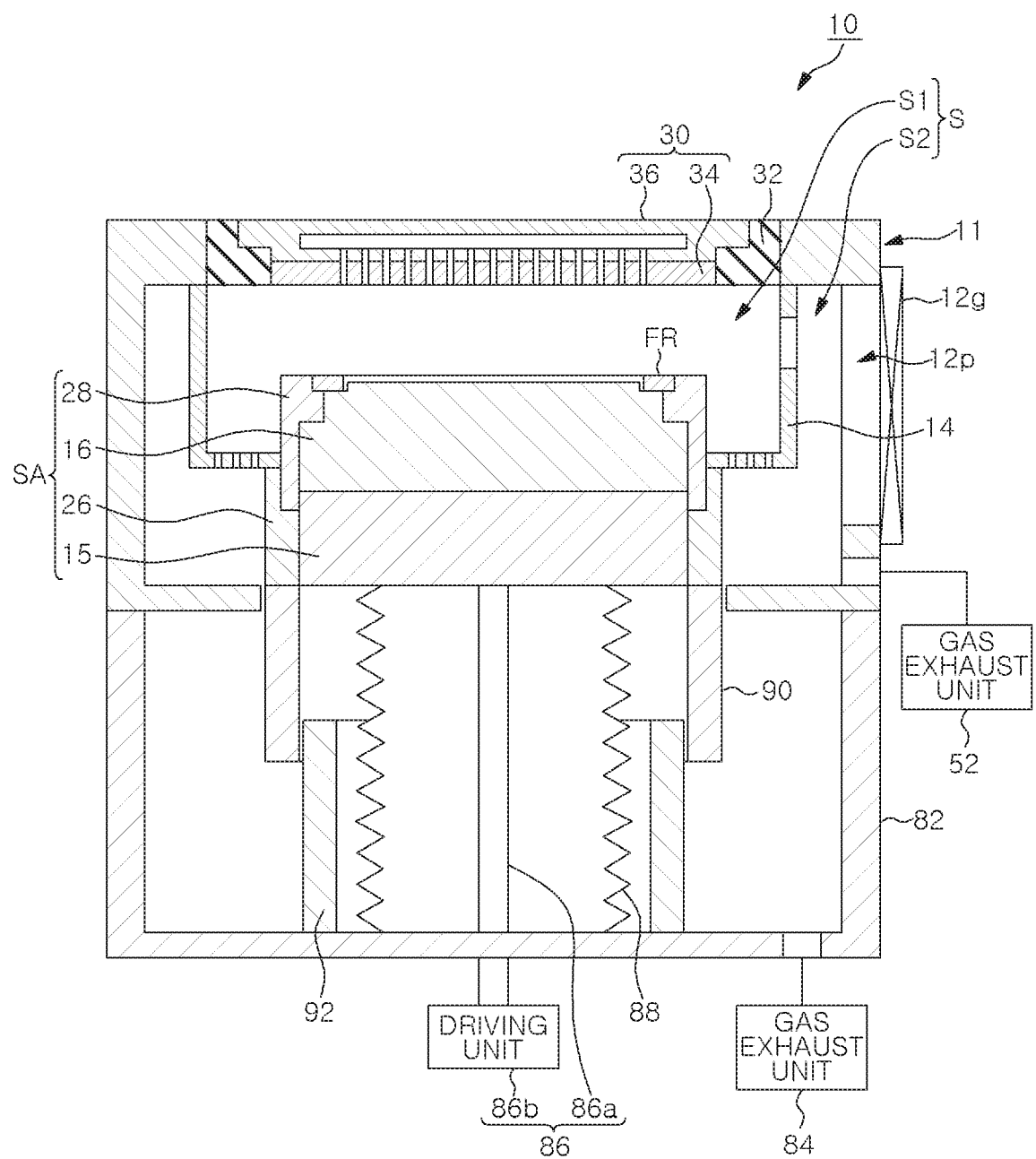
FIG. 18 schematically shows a plasma processing apparatus that can be employed in the processing system shown in FIG. 17.
Figure 19:
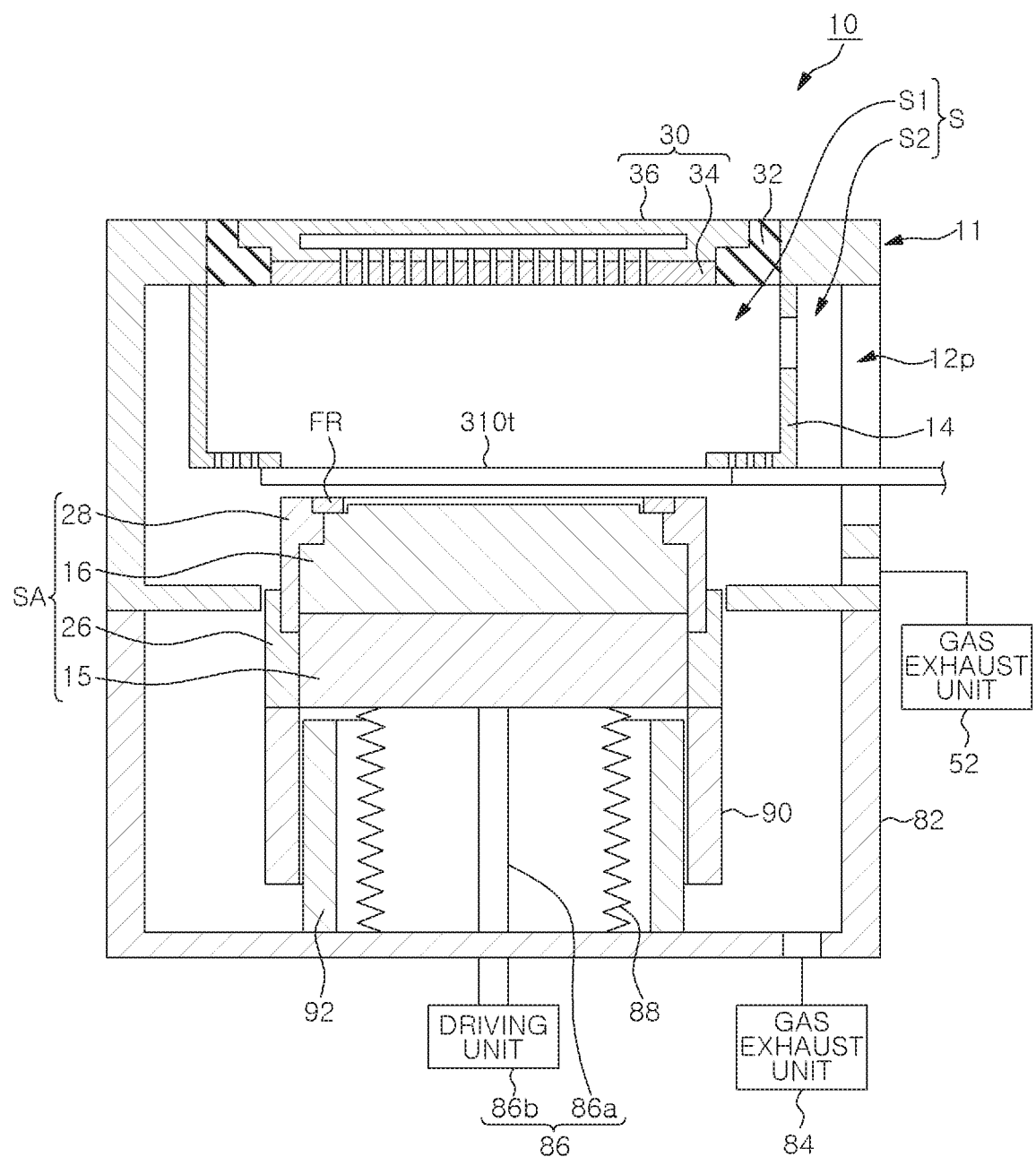
FIG. 19 schematically shows the plasma processing apparatus that can be employed in the processing system shown in FIG. 17.

In the case where the partition wall 14 is a component to be cleaned, the plasma processing apparatus 10 employed in the processing system 300 has the configuration shown in FIGS. 18 and 19. FIGS. 18 and 19 schematically show a plasma processing apparatus that can be employed in the processing system shown in FIG. 17. FIG. 19 shows a state in which the support assembly SA is moved downward. The plasma processing apparatus 10 shown in FIGS. 18 and 19 includes a DC power supply 23, a switch 24, gas supply units 40 and 42, a first high frequency power supply 61, a matching unit 63, a second high frequency power supply 62, a matching unit 64, a heater 72, a heater controller HC20, a heater controller HC72, a control unit 80, and the like, as in the case of the plasma processing apparatus 10 shown in FIG. 2. Hereinafter, only the differences between the plasma processing apparatus shown in FIGS. 18 and 19 and the plasma processing apparatus 10 shown in FIG. 2 will be described.

The plasma processing apparatus 10 shown in FIGS. 18 and 19 further includes a lower chamber 82. An opening is formed at the bottom portion of the chamber body 12 of the processing chamber 11. The lower chamber 82 is provided below the bottom of the chamber body 12 and is connected to the bottom portion of the chamber body 12. The space in the lower chamber 82 can be depressurized by a gas exhaust unit 84.

In the plasma processing apparatus 10 shown in FIGS. 18 and 19, the supporting part 15 of the support assembly SA has a substantially disc shape. A lift mechanism 86 is connected to the supporting part 15. The lift mechanism 86 is configured to move the support assembly SA in a vertical direction. The lift mechanism 86 includes, e.g., a slide mechanism 86a having a ball screw, and a driving unit 86b for rotating the ball screw. The ball screw of the slide mechanism 86a extends to a position below the lower chamber 82 while penetrating through the bottom portion of the lower chamber 82. The driving unit 86b is provided below the lower chamber 82. A bellows 88 is provided to surround the slide mechanism 86a between the support assembly SA (e.g., the supporting part 15) and the bottom portion of the lower chamber 82. A tubular member 90 extends downward from the support assembly SA to surround the bellows 88. A tubular member 92 extends upward from the bottom portion of the lower chamber 82. The tubular member 92 is provided between the bellows 88 and the tubular member 90.

In the case of removing the partition wall 14 from the plasma processing apparatus 10 shown in FIGS. 18 and 19, the support assembly SA is moved downward with respect to the partition wall 14, as shown in FIG. 19. The support assembly SA is moved downward by the lift mechanism 86. Then, the robot arm of the transfer mechanism 310t moves to a position below the partition wall 14 and supports the partition wall 14. Then, the fixing of the partition wall to the processing chamber 11 is released. Thereafter, the partition wall 14 is unloaded from the inner space S.

Similarly, in the case of returning the partition wall to a predetermined position in the inner space S, the support assembly SA is moved downward. The support assembly SA is moved downward by the lift mechanism 86. Then, the partition wall 14 is transferred to the predetermined position in the inner space S by the robot arm of the transfer mechanism 310t. Next, the partition wall 14 is fixed to the processing chamber 11. Then, the robot arm of the transfer mechanism 310t retreats from the inner space S. Thereafter, the support assembly SA is moved upward (see FIG. 18). The support assembly SA is moved upward by the lift mechanism 86.

While various embodiments have been described, various modifications can be made without being limited to the above-described embodiments. For example, the plasma processing apparatus including components to be cleaned by the method MT may be an inductively coupled plasma processing apparatus, or a plasma processing apparatus that excites a gas using a surface wave such as a microwave. Further, the component to be cleaned by the method MT is not limited to the partition wall 14 as long as it is disposed in the inner space S. The component may be, e.g., the tubular member 26 or the focus ring FR.

While the present disclosure has been shown and described with respect to the embodiments, it will be understood by those skilled in the art that various changes and modifications may be made without departing from the scope of the present disclosure as defined in the following claims.

What is claimed is:

1. A method for cleaning a component of a plasma processing apparatus which is disposed in an inner space defined by a processing chamber of the plasma processing apparatus, the method comprising:
    forming a film on the surface of the component, wherein a compound forming the film is generated by polymerization of a first compound contained in a first gas and a second compound contained in a second gas, the first compound being isocyanate and the second compound being amine or a compound having a hydroxyl group;
    performing a substrate treatment in the inner space;
    transferring the component from the processing chamber to a heating chamber after the performing the substrate treatment; and
    heating the component so that depolymerization of the compound forming the film occurs.

2. The method of claim 1, further comprising:
    disposing the component in a film forming chamber different from the processing chamber,
    wherein in said forming the film on the surface of the component, the film is formed on the surface of the film in the film forming chamber, and
    wherein after said forming the film on the surface of the component and before the substrate treatment, the component is disposed at a predetermined position in the inner space.

3. The method of claim 2, wherein the processing chamber and the film forming chamber are connected via a depressurizable transfer chamber, and
    in said disposing the component in the film forming chamber and in said disposing the component at the predetermined position in the inner space, the component is transferred by a transfer mechanism between the processing chamber and the film forming chamber via the transfer chamber.

4. The method of claim 3, wherein the heating chamber is connected to the transfer chamber, and
    in said transferring the component, the component is transferred by the transfer mechanism between the processing chamber and the heating chamber via the transfer chamber.

5. The method of claim 2, further comprising, after said heating the component, transferring the component into the film forming chamber.

6. The method of claim 2, wherein the heating chamber is the film forming chamber.

7. The method of claim 1, wherein the substrate treatment includes at least one of film formation and etching.

8. The method of claim 7, wherein the substrate treatment includes film formation using a chemical vapor deposition (CVD) method, film formation using a plasma enhanced CVD method, film formation using an atomic layer deposition (ALD) method, or film formation using a plasma enhanced ALD method.

9. The method of claim 7, wherein the substrate treatment includes the film formation and the etching, wherein the etching is a plasma etching performed after the film formation.

10. The method of claim 9, wherein a substrate to be treated by the substrate treatment includes an underlying film and a mask that is provided on the underlying film and that has an opening, and
    the film formation is performed by an atomic layer deposition method and includes:
    supplying a precursor gas into the inner space;
    purging the inner space;
    supplying a reactant gas that reacts with a precursor contained in the precursor gas into the inner space; and
    purging the inner space,
    wherein the film formed on the substrate by the film formation includes a first region extending along a side wall surface of the mask that defines the opening and a second region extending on the underlying film, and
    the plasma etching is performed to remove the second region without removing the first region.

11. The method of claim 10, wherein in said supplying the reactant gas, plasma of the reactant gas is generated in the inner space.

12. The method of claim 1, wherein the inner space includes a first space where the substrate treatment is performed and a second space separated from the first space, and
    wherein the plasma processing apparatus includes:
    a partition wall extending on a boundary between the first space and the second space and having a plurality of through-holes through which the first space and the second space communicate with each other;
    a supporting table configured to support a substrate mounted thereon in the first space;
    a gas supply system connected to the first space; and
    a gas exhaust unit connected to the second space.

13. The method of claim 12, wherein the surface that defines the inner space includes a first surface that defines the first space and a second surface that defines the second space, and
    the surface of the component includes a region that is a part of the second surface.

* * * * *